United States Patent
Cha et al.

(10) Patent No.: US 10,535,395 B2
(45) Date of Patent: Jan. 14, 2020

(54) MEMORY DEVICE WITH IMPROVED LATENCY AND OPERATING METHOD THEREOF

(71) Applicant: SAMSUNG ELECTRONICS CO., LTD., Suwon-si, Gyeonggi-Do (KR)

(72) Inventors: Soo-Ho Cha, Seoul (KR); Chankyung Kim, Hwaseong-si (KR); Sungchul Park, Seoul (KR); Kwangchol Choe, Seoul (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/599,819

(22) Filed: May 19, 2017

(65) Prior Publication Data
US 2017/0365326 A1 Dec. 21, 2017

(30) Foreign Application Priority Data
Jun. 20, 2016 (KR) .......................... 10-2016-0076694

(51) Int. Cl.
| | |
|---|---|
| G11C 7/00 | (2006.01) |
| G11C 11/408 | (2006.01) |
| G06F 12/02 | (2006.01) |
| G11C 5/06 | (2006.01) |
| G11C 7/10 | (2006.01) |
| G11C 11/4076 | (2006.01) |

(Continued)

(52) U.S. Cl.
CPC ...... *G11C 11/4087* (2013.01); *G06F 12/0207* (2013.01); *G11C 5/063* (2013.01); *G11C 7/1066* (2013.01); *G11C 7/1093* (2013.01); *G11C 11/4076* (2013.01); *G11C 11/4085* (2013.01); *G11C 11/4093* (2013.01); *G11C 11/4096* (2013.01); *G06F 2212/1024* (2013.01); *G11C 2207/107* (2013.01); *G11C 2207/2272* (2013.01)

(58) Field of Classification Search
CPC .................. G06F 2212/1024; G06F 12/0207
See application file for complete search history.

(56) References Cited

U.S. PATENT DOCUMENTS

| | | | |
|---|---|---|---|
| 5,636,174 A | | 6/1997 | Rao |
| 6,002,615 A | * | 12/1999 | Sawada .................. G11C 7/22 |
| | | | 365/189.15 |

(Continued)

OTHER PUBLICATIONS

Lu, Shih-Lien et al., "Improving Dram Latency With Dynamic Asymmetric Subarray", MICRO-48, Dec. 5-9, 2015, Waikiki, HI, USA, pp. 255-266.

(Continued)

*Primary Examiner* — Uyen B Tran
(74) *Attorney, Agent, or Firm* — F. Chau & Associates, LLC

(57) ABSTRACT

Disclosed is a memory device which includes a first memory cell connected to a word line and a first bit line, a second memory cell connected to the word line and a second bit line, and a row decoder selecting the word line, a row decoder configured to select the word line, and a column decoder. A first distance between the row decoder and the first memory cell is shorter than a second distance between the row decoder and the second memory cell. The column decoder selects the first bit line based on a time point when the first memory cell is activated.

19 Claims, 18 Drawing Sheets

(51) Int. Cl.
   *G11C 11/4093*   (2006.01)
   *G11C 11/4096*   (2006.01)

(56) References Cited

U.S. PATENT DOCUMENTS

| | | |
|---|---|---|
| 6,442,098 B1 | 8/2002 | Kengeri |
| 6,449,209 B1 | 9/2002 | Lee |
| 6,898,690 B2 | 5/2005 | Ramagopal et al. |
| 7,254,075 B2 | 8/2007 | Woo et al. |
| 8,363,444 B2 | 1/2013 | Kim et al. |
| 8,891,322 B2 | 11/2014 | Pyeon |
| 9,016,552 B2 | 4/2015 | Sweere |
| 9,171,585 B2 | 10/2015 | Rajan et al. |
| 9,236,350 B2 | 1/2016 | Sutardja |
| 9,287,216 B2 | 3/2016 | Haba et al. |
| 9,287,239 B2 | 3/2016 | Ware et al. |
| 2008/0069145 A1* | 3/2008 | Chung .................... H04L 25/14 370/476 |
| 2008/0253488 A1* | 10/2008 | Kim ........................ G09G 3/20 375/346 |
| 2010/0302851 A1* | 12/2010 | Ryu, II .................. G11C 16/12 365/185.12 |
| 2013/0113523 A1* | 5/2013 | Choi .............. H03K 19/017545 326/82 |
| 2013/0132685 A1* | 5/2013 | Vogelsang .............. G06F 12/00 711/154 |
| 2015/0161005 A1 | 6/2015 | Casper et al. |
| 2015/0234602 A1 | 8/2015 | Seo et al. |
| 2015/0330845 A1* | 11/2015 | Furutani .................. G01K 7/01 374/163 |
| 2016/0062896 A1 | 3/2016 | Eguchi |

OTHER PUBLICATIONS

Son, Young Hoon et al., "Reducing Memory Access Latency With Asymmetric Dram Bank Organizations", ISCA'13, 2013, Tel Aviv, Israel.

* cited by examiner

MEMORY DEVICE WITH IMPROVED LATENCY AND OPERATING METHOD THEREOF

CROSS REFERENCE TO RELATED APPLICATIONS

This application claims priority under 35 U.S. § 119 to Korean Patent Application No. 10-2016-0076694 filed on Jun. 20, 2016, in the Korean Intellectual Property Office, the disclosure of which is incorporated by reference in its entirety herein.

BACKGROUND

1. Technical Field

Embodiments of the inventive concept disclosed herein relate to a memory device, and more particularly, to a method of operating a volatile memory device.

2. Discussion of Related Art

Semiconductor memory devices are classified into a volatile memory device and a nonvolatile memory device. The read and write speed of a volatile memory device is fast, but data stored therein is lost when a power supply voltage is interrupted. In contrast, a nonvolatile memory device retains data stored therein even when the power supply voltage is interrupted.

In particular, the read and write speeds of the volatile memory device, such as a dynamic random access memory (DRAM), are fast. Accordingly, a DRAM may be used as a data storage device such as a solid state drive (SAD) or as a main memory of a computing system.

There is an increasing need for a large-capacity DRAM. However, latency in response time may increase when the capacity of a DRAM is increased too greatly.

SUMMARY

At least one embodiment of the inventive concept provides a memory device having improved read and write speeds.

A memory device according to an exemplary embodiment of the inventive concept includes a first memory cell connected to a word line and a first bit line, a second memory cell connected to the word line and a second bit line, and a row decoder for selecting the word line. A first distance between the row decoder and the first memory cell is shorter than a second distance between the row decoder and the second memory cell. The first bit line is selected based on a time point when the first memory cell is activated.

A memory device according to an exemplary embodiment of the inventive concept includes a first memory block including a first memory cell connected to a word line and a first bit line, a second memory block including a second memory cell connected to the word line and a second bit line, and a row decoder for selecting the word line. A first distance between the row decoder and the first memory cell is shorter than a second distance between the row decoder and the second memory cell. The first bit line is selected based on a time point when the first memory cell is activated.

An exemplary embodiment of the inventive concept is directed to a method of operating a memory device that includes a first memory cell and a second memory cell connected to a row decoder through a word line and connected to a column decoder through a first bit line and a second bit line. The method includes activating the first memory cell and the second memory cell connected to the word line selected by the row decoder, and selecting the first bit line and the second bit line based on a time point when the first memory cell is activated. A first distance between the row decoder and the first memory cell is shorter than a second distance between the row decoder and the second memory cell.

A memory device according to an exemplary embodiment of the inventive concept includes a first memory cell connected to a word line and a first bit line, a second memory cell connected to the word line and a second bit line, a row decoder configured to select the word line, and a pulse generator configured to generate a first pulse based on a time point when the first memory cell is activated to control the latch to output the first read data in response to the first pulse. A first distance between the row decoder and the first memory cell is shorter than a second distance between the row decoder and the second memory cell.

BRIEF DESCRIPTION OF THE FIGURES

The inventive concept will become apparent from the following description with reference to the following figures, wherein like reference numerals refer to like parts throughout the various figures unless otherwise specified, and wherein.

DETAILED DESCRIPTION OF THE EXEMPLARY EMBODIMENTS

Hereinafter, exemplary embodiments of the inventive concept will be described more fully with reference to accompanying drawings. Below, details, such as detailed configurations and structures, are provided to aid a reader in understanding embodiments of the inventive concept. Therefore, embodiments described herein may be variously changed or modified without departing from embodiments of the inventive concept.

Figure 1:
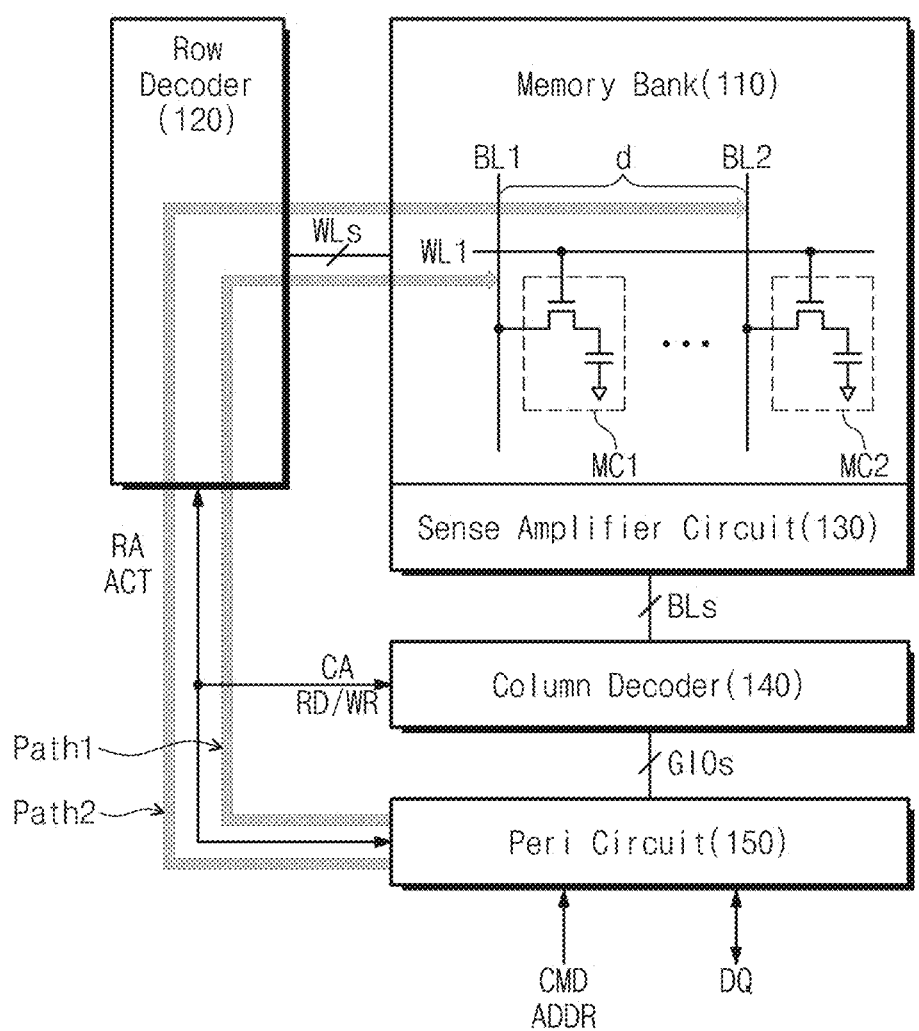
FIG. 1 is a block diagram illustrating of a memory device according to an exemplary embodiment of the inventive concept.

FIG. 1 is a block diagram illustrating an example of a memory device according to an embodiment of the inventive concept. Referring to FIG. 1, a memory device 100 includes a memory bank 110, a row decoder 120, a sense amplifier circuit 130, a column decoder 140, and a peripheral circuit 150. The sense amplifier circuit 130 may include one or more sense amplifiers.

The memory bank 110 includes a plurality of memory cells. The memory cells are connected to a plurality of word lines WLs and a plurality of bit lines BLs. For example, the memory cells may be DRAM cells. In an embodiment where each memory cell is a DRAM cell, each memory cell includes an access transistor and a cell capacitor. However, the structure of each memory cell is not limited thereto. For convenience of description, only a first memory cell MC1 and a second memory cell MC2 are illustrated in FIG. 1. As illustrated in FIG. 1, a distance between the row decoder 120 and the first memory cell MC1 is shorter than a distance between the row decoder 120 and the second memory cell MC2.

The row decoder 120 is connected to the memory bank 110 through the word lines WLs. The row decoder 120 is configured to select at least one word line of the word lines in response to a row address RA from the peripheral circuit 150. The row decoder 120 may activate at least one word line in response to an activation signal ACT from the peripheral circuit 150.

The sense amplifier circuit 130 is configured to sense and amplify a voltage of a bit line selected by the column decoder 140. For example, in an embodiment where the memory bank 110 includes a plurality of sub-arrays, the sense amplifier circuit 130 includes a plurality of sense amplifiers (not illustrated). The sense amplifiers may be provided for respective sub-arrays.

The column decoder 140 is connected to the memory bank 110 through the bit lines BLs. The column decoder 140 is configured to select at least one bit line of the bit lines BLs in response to a column address CA from the peripheral circuit 150. The column decoder 140 may turn on or off a selection transistor (not illustrated) connected to each memory cell in response to a read command RD or a write command WR from the peripheral circuit 150. A read operation or a write operation may be performed on a memory cell as the selection transistor is turned on or off.

The peripheral circuit 150 may receive a command CMD and an address ADDR from an outside source (e.g., a host or a memory controller). The peripheral circuit 150 may output read data DQ to the outside source or may receive write data DQ from the outside source. In an embodiment, the peripheral circuit 150 generates the row address RA, the column address CA, the activation signal ACT, the read command RD, and the write command WR based on the command CMD and the address ADDR.

A read operation of the memory device 100 will be described as an example. At least one word line of the word lines WLs may be selected according to the row address RA, and the selected word line (e.g., WL1) may be activated by the activation signal ACT. One or more bit lines (e.g., BL1 and BL2) of the bit lines BLs may be selected according to the column address CA, and the read operation may be performed by the read command RD. As illustrated in FIG. 1, a difference "d" is present between a path path1 through which the activation signal ACT is provided to the first memory cell MC1 and a path path2 through which the activation signal ACT is provided to the second memory cell MC2. Due to the path difference "d", timings when memory cells connected to the word line WL1 are activated may be different from each other.

An operating speed of the memory device 100 may become slower due to a difference between timings when memory cells are respectively activated. After memory cells connected to the selected word line WL1 are activated according to an input of the activation signal ACT and a reference time (e.g., ACT to internal read or write delay time (tRCD)) elapses, the column address CA and the read command RD are provided to the column decoder 140. The "tRCD" may be calculated based on a time at which a memory cell (e.g., MC2) farthest from the row decoder 120 is activated. That is, after the reference time (i.e., tRCD) elapses from a time point when a memory cell (e.g., MC2) farthest from the row decoder 120 is activated, the column address CA and the read command RD are provided to the column decoder 140. The above-described way may be also applied to the write operation.

However, the latency may increase as the size of the memory bank 110 increases, thereby causing reduction in performance of the memory device 100. However, according to an embodiment of the inventive concept, the input of the column address CA, the read command RD, or the write command WR to the column decoder 140 is not determined based on the time point when a memory cell (e.g., MC2) farthest from the row decoder 120 is activated. For example, according to an embodiment of the inventive concept, after the reference time (i.e., tRCD) elapses from a time point when a memory cell (e.g., MC1) closest to the row decoder 120 is activated, the column address CA and the read command RD are provided to the column decoder 140.

In addition, according to an embodiment of the inventive concept, in the case where deserialized data read from the memory bank 110 during a read operation is serialized, serialization of the read data is performed even before data is completely read from all memory cells connected to a selected word line. As in the above description, deserialization of write data may be performed even before the serialized write data received from the outside during a write operation is completely received.

Figure 2:
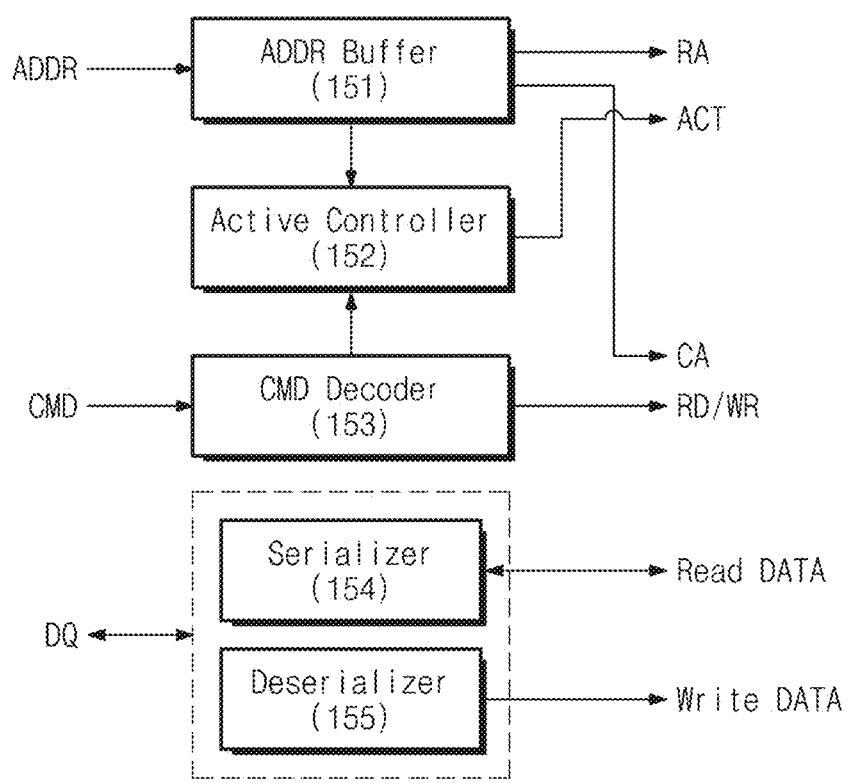
FIG. 2 is a detailed block diagram of a peripheral circuit illustrated in FIG. 1.

FIG. 2 is a detailed block diagram of the peripheral circuit 150 illustrated in FIG. 1. Referring to FIG. 2, the peripheral circuit 150 includes an address buffer 151, an active controller 152, a command decoder 153, a serialize 154, and a deserializer 155. To help understanding, a description will be given with reference to FIGS. 1 and 2.

The address buffer 151 receives an address ADDR of a memory cell to be accessed from the outside (e.g., a host). The address buffer 151 generates the row address RA and the column address CA based on the received address ADDR. The row address RA is provided to the row decoder 120, and the column address CA is provided to the column decoder 140. The row address RA may identify a specific row of memory cells and the column address may indicate a specific column of memory cells.

The active controller 152 generates the active command ACT based on the address ADDR from the address buffer 151 and the command CMD from the command decoder 153. The activation signal ACT may be provided to the row decoder 120. For example, the row address RA may be provided to the memory bank 110 after the reference time (i.e., tRCD) elapses from a time point when the second memory cell MC2 farthest from the row decoder 120 is activated by the activation signal ACT provided to the first word line WL1.

The command decoder 153 decodes the command CMD provided from the outside (e.g., the host) to generate the read command RD, the write command WR, etc. The read command RD and the write command WR may be provided to the column decoder 140.

The serialize 154 serializes read data read from the memory bank 110. The serialized data DQ may be output to the outside through a DQ pad (not illustrated). For example, in response to the serialize 154 receiving first data, second data, and third data, the serialize 154 could generate serial data in the same order it is read (e.g., second data following the first data and third data following the second data) or in a different order (e.g., third data following the second data and first data following the second data).

The deserializer 155 deserializes write data DQ received from the outside (e.g., the host). The deserialized write data may be stored in memory cells through bit lines. For example, the deserializer 155 could extract sections of a serialized data to form deserialized data.

Although not illustrated in FIG. 2, the peripheral circuit 150 may further include a write driver circuit for storing write data in the memory bank 110. In this case, the write driver circuit may receive the deserialized write data from the deserializer 155 and may write the deserialized write data into the memory bank 110.

According to an exemplary embodiment of the inventive concept, the active controller 152 provides the activation signal ACT to a selected word line WL1, and thus, memory cells connected to the selected word line WL1 are activated. For example, the activation signal ACT applied to the selected word line WL1 is applied to gate terminals of transistors within the memory cells attached to the selected word line WL to turn on those transistors. However, the command decoder 153 does not provide the read command RD or the write command WR to the column decoder 140 based on a time point when a memory cell (e.g., MC2) farthest from the row decoder 120 is activated. For example, the command decoder 153 instead provides the read command RD or the write command WR to the column decoder 140 based on a time point when a memory cell (e.g., MC1) closest to the row decoder 120 is activated. In an alternative embodiment, the command decoder 153 provides the read command RD or the write command WR to the column decoder 140 based on a time point when a memory cell (not illustrated) arranged between a memory cell (e.g., MC2) farthest from the row decoder 120 and a memory cell (e.g., MC1) closest to the row decoder 120 is activated.

For example, a time point when a memory cell (e.g., MC1) closest to the row decoder 120 is activated by the activation signal ACT may be measured in advance by a memory manufacturer. That is, a timing when the read command RD or the write command WR is provided to the column decoder 140 after the activation signal ACT is provided to a selected word line (e.g., WL1) may be determined in advance by a memory manufacturer. The measured time period from activation of the closest memory cell to providing of a read command RD or a write command WR (tRCD) may be stored in a memory cell of the memory device 100. The measured time period can then be loaded once when the memory device 100 is powered on so that the peripheral circuit 150 knows when to apply the read or write command after activating the activation ACT signal.

In a previous embodiment, the read command RD or the write command WR is provided to the column decoder 140 after "tRCD" elapses from a time point when the memory cell MC2 farthest from the row decoder 120 is activated. However, according to an exemplary embodiment of the inventive concept, the column address ADDR and the read command RD are instead provided to the column decoder 140 after "tRCD" elapses from a time point when the memory cell MC1 closest to the row decoder 120 is activated. Accordingly, since it is possible to advance a time point when the column address CA and the read command RD are provided to the column decoder 140, a read speed of the memory device 100 may be improved. The above-described operation may be also applied to the write operation of the memory device 100.

An embodiment is exemplified in FIG. 2 as the peripheral circuit 150 generates the activation signal ACT by using the command CMD from the outside. However, in some embodiments, the activation signal ACT may be directly received from outside of the memory device 100. This will be described with reference to FIG. 3.

Figure 3:
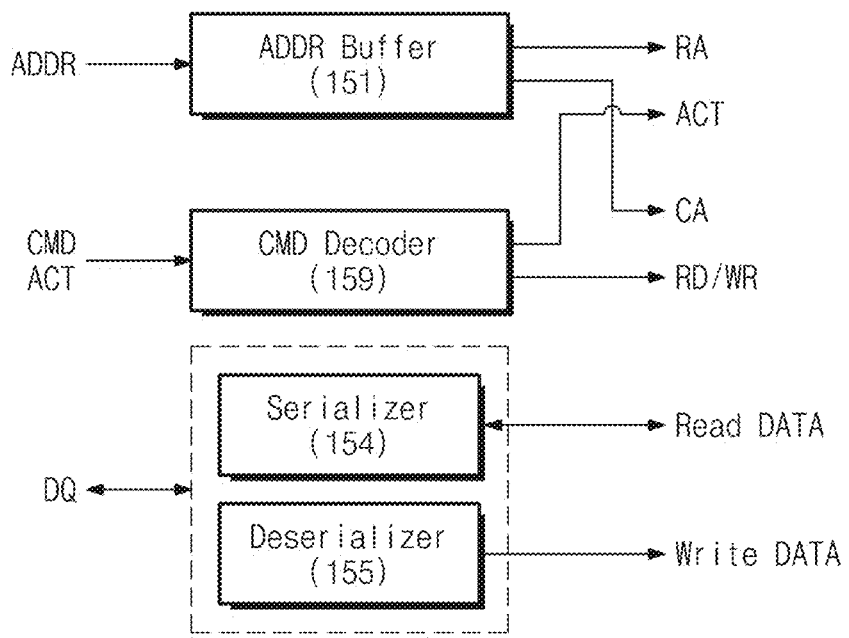
FIG. 3 is a block diagram illustrating another example of the peripheral circuit illustrated in FIG. 1.

FIG. 3 is a block diagram illustrating another example of the peripheral circuit 150 illustrated in FIG. 1. Referring to FIG. 3, the peripheral circuit 150 includes the address buffer 151, the serialize 154, the deserializer 155, and a command decoder 159. Functions of the address buffer 151, the serialize 154, and the deserializer 155 are similar to those of FIG. 2, and thus, a description thereof will not be repeated here. To help understanding, a description will be given with reference to FIGS. 1 and 3.

The command decoder 159 receives the command CMD and the activation signal ACT from the outside (e.g., the host). The command decoder 159 provides the received activation signal ACT to the row decoder 120 (refer to FIG. 1). The command decoder 159 decodes the received command CMD to generate the read command RD or the write command WR.

As in the embodiment described with reference to FIG. 2, after a memory cell (e.g., MC1) closest to the row decoder 120 is activated and "tRCD" elapses, the command decoder 159 provides the column address CA, the read command RD, or the write command WR to the column decoder 140. Alternatively, after a memory cell (not illustrated) arranged between a memory cell (e.g., MC1) closest to the row decoder 120 and a memory cell (e.g., MC2) farthest from the row decoder 120 is activated and "tRCD" elapses, the command decoder 159 provides the column address CA, the read command RD, or the write command WR to the column decoder 140.

With the above-described configuration, even though the size of the memory bank 110 increases, it may be possible to prevent a decrease in read or write operating speed due to an increase in latency.

Figure 4:
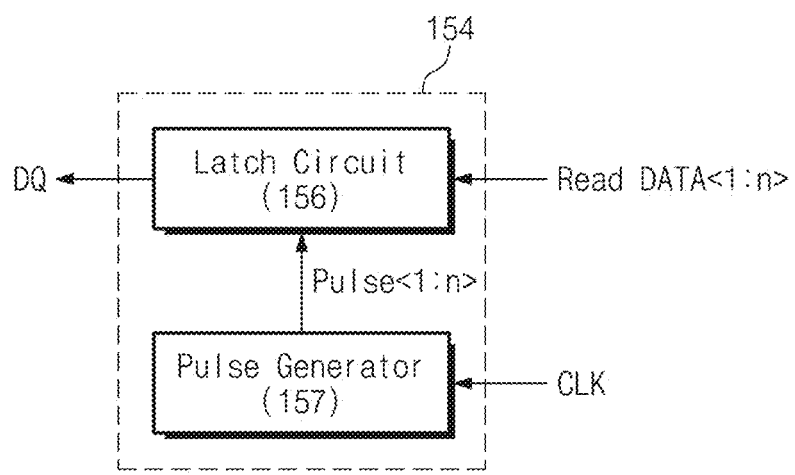
FIG. 4 is a block diagram illustrating an example of a serialize illustrated in FIGS. 2 and 3.

FIG. 4 is a block diagram illustrating an example of the serialize 154 illustrated in FIG. 2. Referring to FIG. 4, the serialize 154 includes a latch circuit 156 and a pulse generator 157. The pulse generator 157 may be implemented by a signal generator or a square wave signal generator. During a read operation, deserialized data Read DATA<1:n> is read from "n" memory cells (e.g., 2 or more memory cells). The pulse generator 157 generates "n" pulses (e.g., 2 or more pulses) by using a clock signal CLK. The clock signal CLK may be a clock received from the outside or a modulated clock. The "n" pulses may be pulses that are delayed from each other by a constant period. The latch circuit 156 generates serialized data DQ by using the "n" pulses and the read data Read DATA<1:n>.

Figure 5:
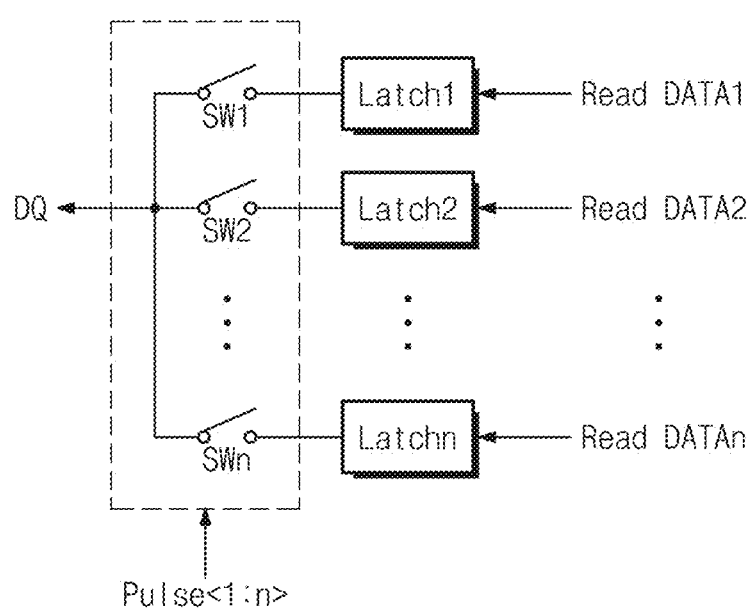
FIG. 5 is a block diagram illustrating a latch circuit of FIG. 4.

FIG. 5 is a block diagram illustrating the latch circuit of FIG. 4. Referring to FIGS. 4 and 5, the latch circuit 156 includes a plurality of switches SW1 to SWn and a plurality of latches Latch 1 to Latchn. The read data Read DATA1 to Read DATAn read from memory cells of a selected word line are respectively input to the latches Latch1 to Latchn. The switches SW1 to SWn are respectively turned on by the pulses Pulse<1:n> that are generated by the pulse generator 157. In an embodiment, each switch is a transistor. For example, a first pulse signal may be applied to a gate terminal of the transistor of the first switch and a second pulse signal may be applied to a gate terminal of the transistor of the second switch, where the second pulse signal is delayed from the first pulse signal so that first read data DAT1 is output first and second read data DAT2 is output second. Since the pulses Pulse<1:n> are sequentially delayed by a constant period, the serialized read data DQ is generated by combining pieces of read data output within an interval during which each of the switches SW1 to SWn is turned on. In FIG. 4, an embodiment is exemplified as the latch circuit 156 being composed of a plurality of switches and a plurality of latches. However, a configuration of the latch circuit 156 is not limited thereto.

Figure 6:
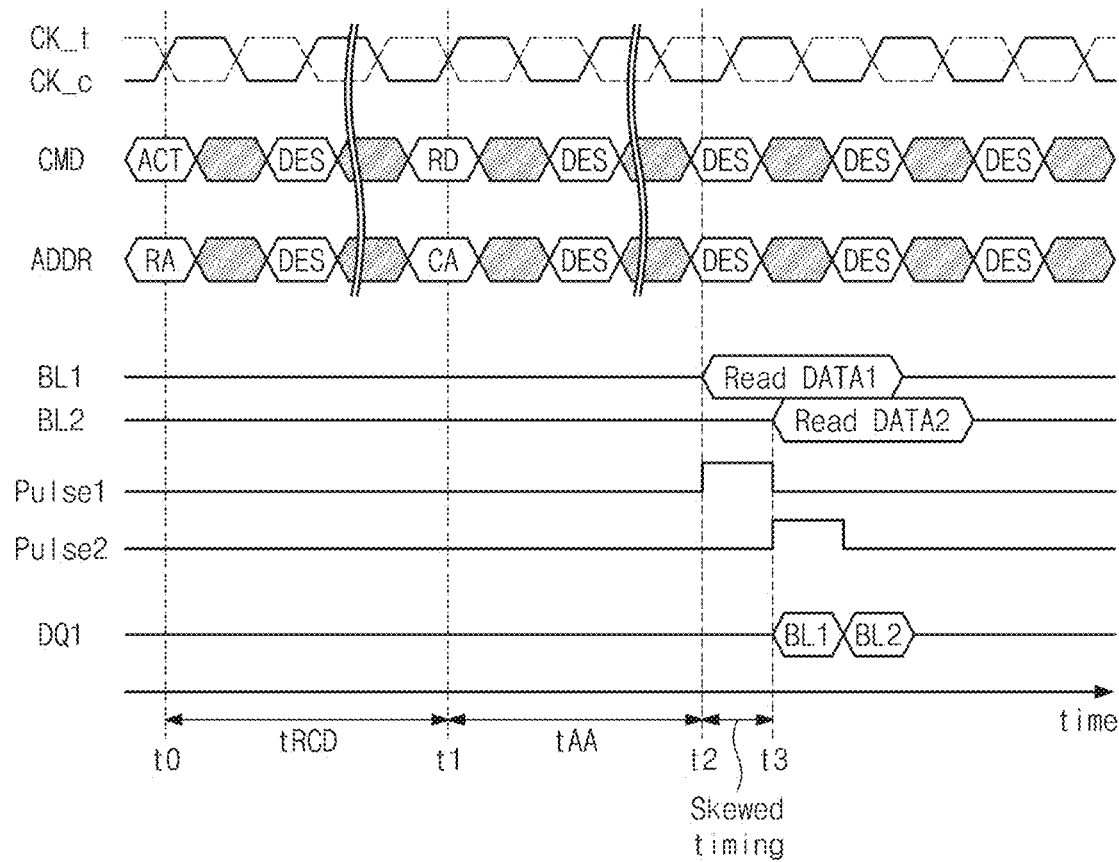
FIG. 6 is a timing diagram for describing a read operation of the memory device of FIG. 1.

FIG. 6 is a timing diagram for describing a read operation of the memory device 100 of FIG. 1. For convenience of description, it is assumed that the first memory cell MC1 and the second memory cell MC2 are only connected to the word line WL1. That is, it is assumed that a burst length is "2". To help understanding, a description will be given with reference to FIGS. 1 to 6.

If a read request is received from a host, at time t0, a word line is selected by the row address RA that is provided from the row decoder 120 to the memory bank 110. The activation signal ACT is provided to a selected word line (e.g., WL1). Afterwards, after the reference time (i.e., tRCD) elapses from a time point when a memory cell (e.g., MC1) closest to the row decoder 120 is activated, the column address CA and the read command RD are provided to the column decoder 140. In this case, "tRCD" is calculated from a time point when the memory cell MC1 closest to the row decoder 120 is activated. That is, according to an embodiment of the inventive concept, it is possible to advance a timing t1 when the read command RD and the column address CA are input to the column decoder 140. Accordingly, a read speed of the memory device 100 may be improved.

First read data Read DATA1 is output from a first bit line BL1 at a time point t2 when a reference time tAA (internal read command to first data) elapses after the read command RD is provided to the column decoder 140. Since the second memory cell MC2 is activated later than the first memory cell MC1, second read data Read DATA2 is output from a second bit line BL2 at a time point t3. That is, skewed timing may exist due to a distance "d" between the first bit line BL1 and the second bit line BL2. Accordingly, the skewed timing may become greater as the size of the memory bank 110 increases. This causes a decrease in read operating speed.

However, according to an embodiment of the inventive concept, read data is not serialized after data is read from all memory cells connected to the word line WL1. For example, at a time point t2, the serialize 154 serializes the first read data Read DATA1 by using the first read data Read DATA1 and a first pulse Pulse1, as soon as the first read data Read DATA1 is output. At a time point t3, the serialize 154 serializes the second read data Read DATA2 by using the second read data Read DATA2 and a second pulse Pulse2, as soon as the second read data Read DATA2 is output. The serialized data may be output from the serialize 154 as DQ1. For example, the serialized data may be output to the outside through a DQ pad (not illustrated).

With the above-described operating method, serialized read data DQ1 may be generated by performing serialization the moment that each read data is output. Accordingly, it may be possible to prevent a decrease in read speed due to an increase in the skewed timing.

Figure 7:
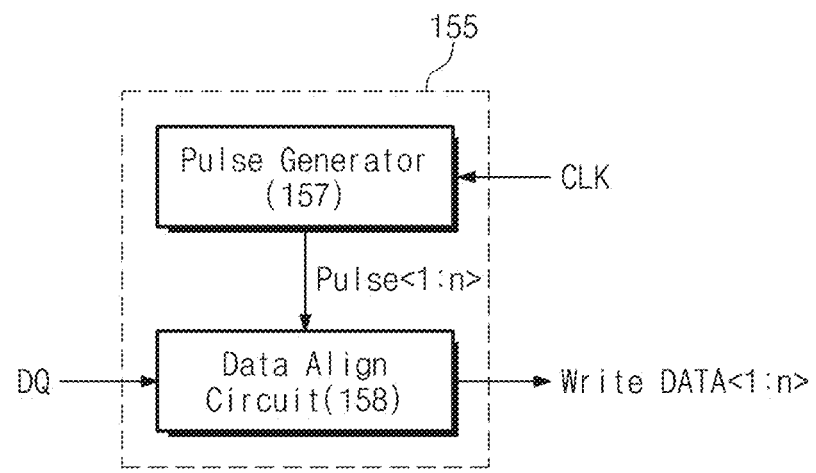
FIG. 7 is a block diagram illustrating a configuration of a deserializer illustrated in FIGS. 2 and 3.

FIG. 7 is a block diagram illustrating a configuration of the deserializer 155 illustrated in FIGS. 2 and 3. Referring to FIG. 7, the deserializer 155 includes the pulse generator 157 and a data align circuit 158. During a write operation, serialized write data DQ received from the outside is input to the data align circuit 158. The pulse generator 157 generates "n" (e.g., 2 or more) pulses by using the clock signal CLK. The "n" pulses may be pulses that are delayed from each other by a constant period. The data align circuit 158 generates deserialized data Write DATA<1:n> by using the "n" pulses and the write data DQ. For example, the deserialized data Write DATA<1:n> may be stored in memory cells of a selected word line.

Figure 8:
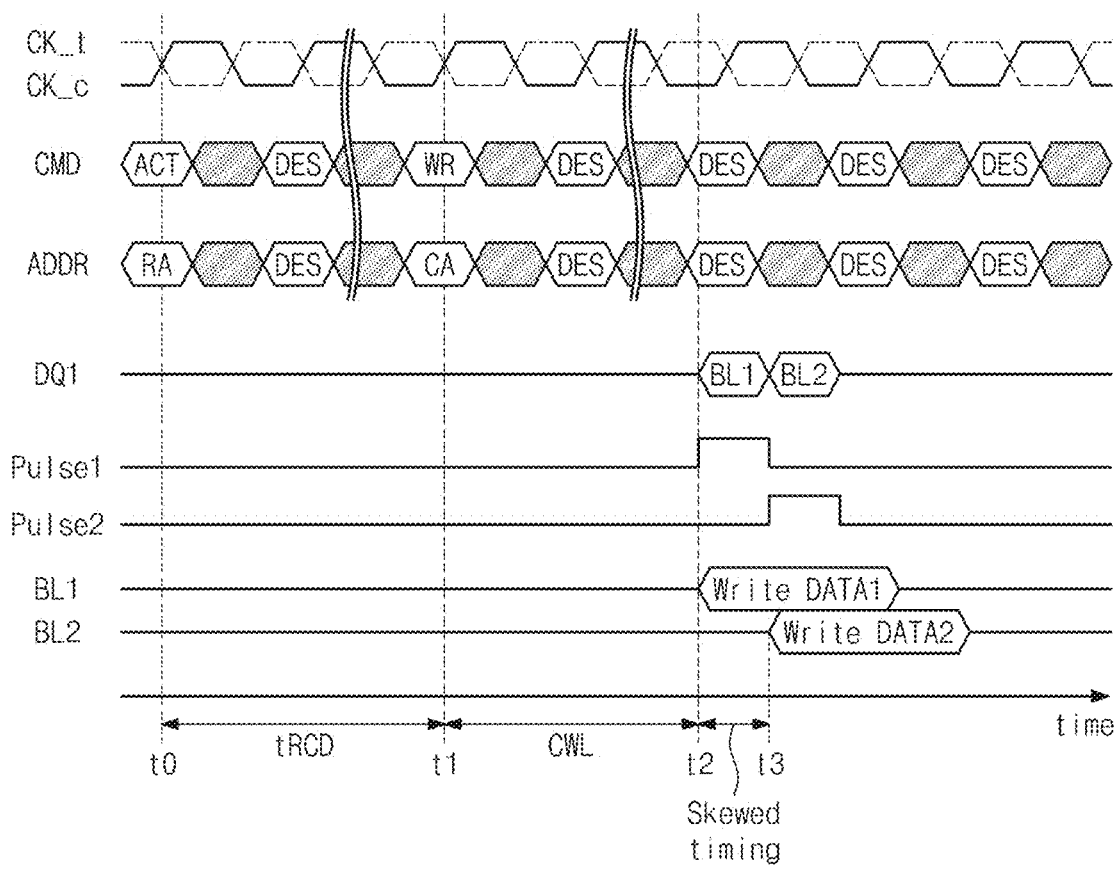
FIG. 8 is a timing diagram for describing a write operation of the memory device of FIG. 1.

FIG. 8 is a timing diagram for describing a write operation of the memory device 100 of FIG. 1. For convenience of description, it is assumed that the first memory cell MC1 and the second memory cell MC2 are only connected to the word line WL1 and a burst length is "2". To help understanding, a description will be given with reference to FIGS. 1, 2, 7, and 8.

If a write request is received from a host, at time t0, a word line WL1 is selected by the row address RA that is provided from the row decoder 120 to the memory bank 110. The activation signal ACT is provided to the selected word line WL1. Afterwards, the column address CA and the write command WR are provided to the column decoder 140 at time t1 when a reference time elapses from a time point when a memory cell MC1 closest to the row decoder 120 is activated (e.g., at t1 when "tRCD" elapses). Accordingly, "tRCD" is calculated from a time point when the memory cell MC1 closest to the row decoder 120 is activated. In this case, it may be possible to advance a timing when the write command WR and the column address CA are input to the column decoder 140. This means that a write speed of the memory device 100 may be improved.

In addition, according to an exemplary embodiment of the inventive concept, deserialization of write data DQ1 is performed even though the write data DQ1 has not been completely received from the outside. For example, at time t2 when a reference time (e.g., a column address strobe CAS write latency (CWL)) elapses after the write command WR is provided to the row decoder 140, the deserializer 155 generates first write data Write DATA1 by using the write data DQ1 and a first pulse Pulse1 generated by the pulse generator 157. At time t3, the deserializer 155 generates second write data Write DATA2 by using the write data DQ1 and a second pulse Pulse2 generated by the pulse generator 157. The first write data Write DATA1 and the second write data Write DATA2 may be respectively stored in the first memory cell MC1 and the second memory cell MC2.

That is, timings when pieces of write data are respectively stored in memory cells may be different from each other due to a difference between activation timings, which occurs due to a distance "d" between the first bit line BL1 and the second bit line BL2 (i.e., the skewed timing exists). Accordingly, the skewed timing may become greater as the size of the memory bank 110 increases. This causes a decrease in write operating speed. However, according to the above-described write method, deserialization may be performed as soon as the write data DQ1 is received, thereby preventing a decrease in write speed due to an increase in the skewed timing.

Figure 9:
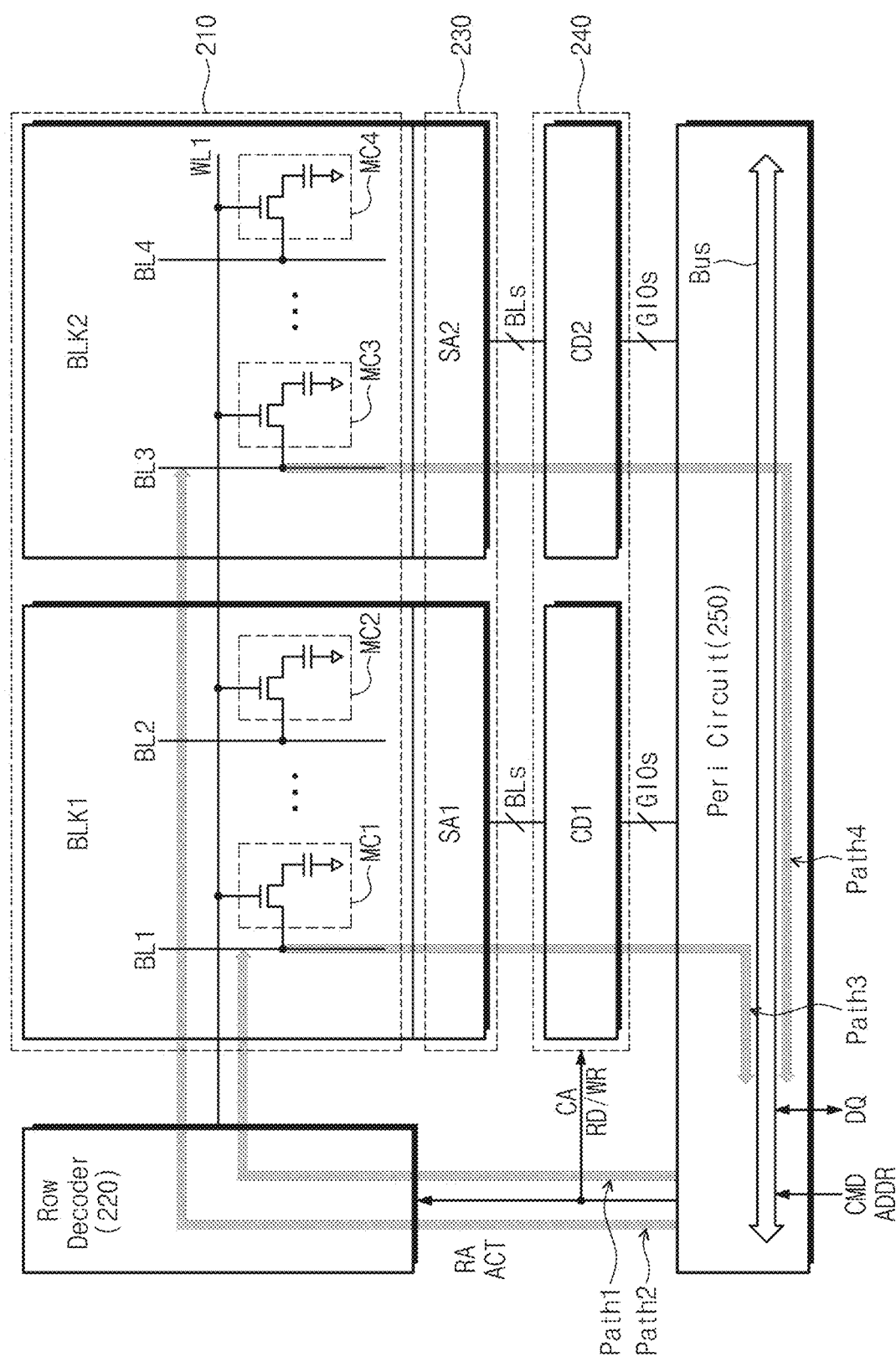
FIG. 9 is a block diagram illustrating a memory device according to an exemplary embodiment of the inventive concept.

FIG. 9 is a block diagram illustrating a memory device according to an exemplary embodiment of the inventive concept. Referring to FIG. 9, a memory device 200 includes a memory bank 210, a row decoder 220, a sense amplifier circuit 230, a column decoder circuit 240, and a peripheral circuit 250.

The memory bank 210 includes a first memory block BLK1 and a second memory block BLK2. The sense amplifier circuit 230 includes a first sense amplifier SA1 and a second sense amplifier SA2. The column decoder circuit 240 includes a first column decoder CD1 and a second column decoder CD2. A configuration of FIG. 9 is substantially the same as that of FIG. 1 except the memory bank 210 is divided into two blocks and a sense amplifier and a column decoder are provided for each block, and thus, a description thereof will not be repeated here.

The first sense amplifier SA1 is connected to the first memory block BLK1 for a read operation and a write operation of the first memory block BLK1. The first column decoder CD1 is connected to the first memory block BLK1 through bit lines BLs and is connected to the peripheral circuit 250 through global input/output lines GIOs. The second sense amplifier SA2 is connected to the second memory block BLK2 for a read operation and a write operation of the second memory block BLK2. The second column decoder CD2 is connected to the second memory block BLK2 through bit lines BLs and is connected to the peripheral circuit 250 through global input/output lines GIOs.

A first memory cell MC1 to a fourth memory cell MC4 are connected to a first word line WL1. The first memory cell MC1 to the fourth memory cell MC4 are respectively connected to a first bit line BL1 to a fourth bit line BL4.

The peripheral circuit 250 may include the address buffer, the active controller, the command decoder, the serialize, and the deserializer that are described with reference to FIG. 2 or 3. A configuration of the peripheral circuit 250 is substantially the same as that illustrated in FIG. 2 or 3, and thus, a description thereof will not be repeated here.

In FIG. 9, shaded arrows indicate flows of a command and read data during a read operation. In detail, each of a first path path1 and a second path2 indicates a path through which the activation signal ACT is provided to each of the first memory cell MC1 and the third memory cell MC3. A third path path3 indicates a path through which data read from the first memory cell MC1 is provided to the outside, and a fourth path path4 indicates a path through which data read from the third memory cell MC3 is provided to the outside. For ease of illustration, paths associated with a second memory cell MC2 and a fourth memory cell MC4 are omitted in FIG. 9.

During a read operation of the memory device 200, timings when the first memory cell MC1 to the fourth memory cell MC4 are activated by the activation signal ACT are different from each other. In addition, lengths of paths through which data respectively read from the first memory cell MC1 to the fourth memory cell MC4 are output are different from each other. In this case, a read speed may be improved by providing the read command RD to the column decoder 240 with respect to a memory cell that is activated fastest. In addition, when data read from memory cells is serialized, the read speed may be further improved by latching data whenever data is read from each bit line. A read operation of an embodiment where a plurality of memory blocks are connected to one row decoder will be described with reference to FIGS. 10 and 11.

Figure 10:
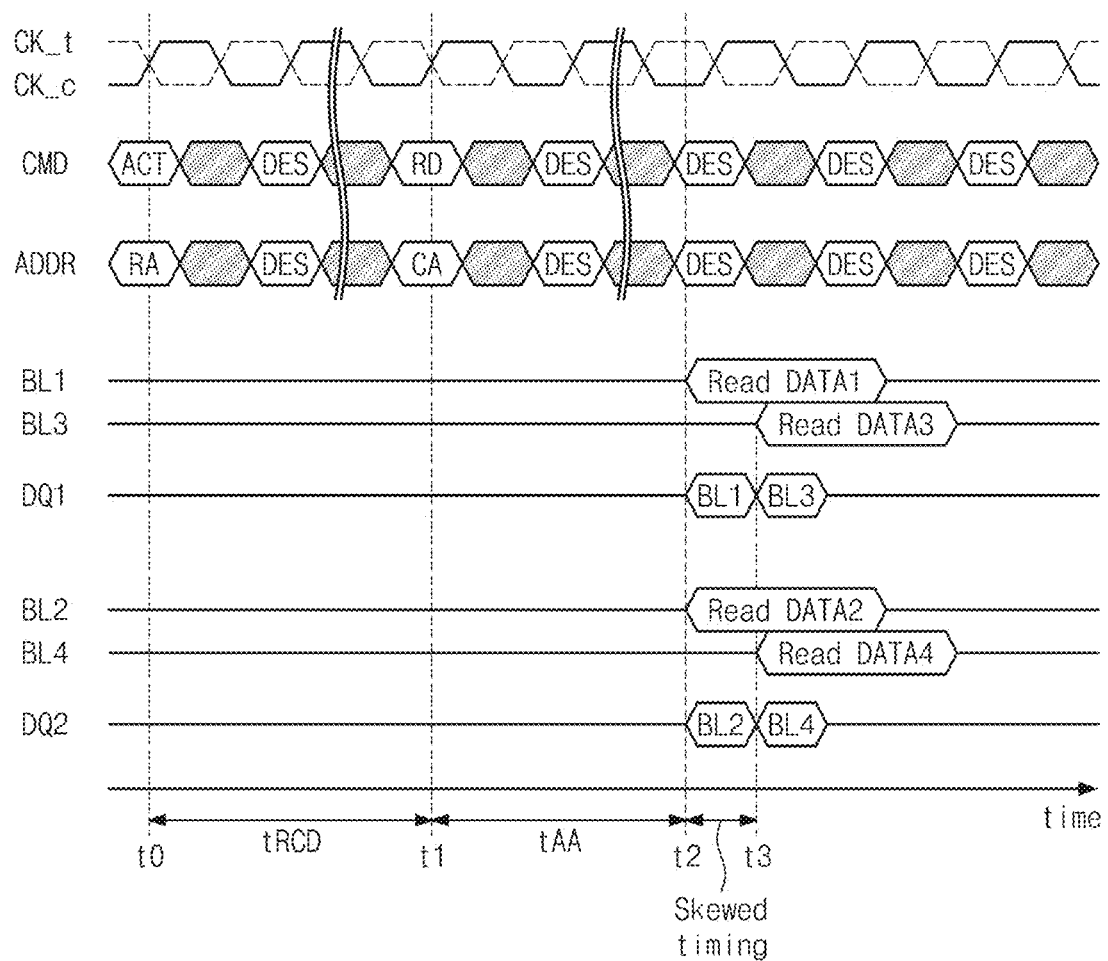
FIG. 10 is a timing diagram for describing a read operation of the memory device of FIG. 9.

FIG. 10 is a timing diagram for describing a read operation of the memory device 200 of FIG. 9. For convenience of description, it is assumed that the first memory cell MC1 to the fourth memory cell MC4 are only connected to the first word line WL1. A read operation of FIG. 10 will be described under assumption that a burst length is "2". To help understanding, a description will be given with reference to FIGS. 1, 2, 9, and 10.

If a read request is received from a host, at time t0, the first word line WL1 is selected by the row address RA. At time t0, the activation signal ACT for activating memory cells connected to the first word line WL1 is provided to the first word line WL1. In this case, the first memory cell MC1 is activated fastest, and the fourth memory cell MC4 is activated slowest.

In a memory device that does not make use of embodiments of the inventive concept, if the read command RD is provided to the column decoder 240 based on a time point when all memory cells are activated, a read speed may become slower as the size of the memory bank 210 increases. However, according to an embodiment of the inventive concept, the command decoder 153 (refer to FIG. 2) does not provide the read command RD to the column decoder 240 based on a timing when a memory cell (e.g., MC4) farthest from the row decoder 220 is activated. For example, the command decoder 153 instead provides the read command RD to the column decoder 240 at time t1 when a reference time (e.g., tRCD) elapses from a time t0 when a memory cell (e.g., MC1) closest to the row decoder 220 is activated. Accordingly, a read speed of the memory device 200 may be improved by making a time point, at which the column address CA and the read command RD are provided, earlier.

Data may be read from memory cells after a reference time (e.g., tAA) elapses from a time t1 when the read command RD is provided to the column decoder 240. First read data Read DATA1 is read from the first memory cell MC1 fastest, and fourth read data Read DATA4 is read from the fourth memory cell MC4 slowest.

In this case, serialization is performed such that the first read data Read DATA1 and third read data Read DATA3 constitute "DQ1", and serialization is made such that the second read data Read DATA2 and the fourth read data Read DATA4 constitute "DQ2". Since a length of a path through which the first read data Read DATA1 is output to the serialize 154 is different from a length of a path through which the fourth read data Read DATA4 is output to the serialize 154, synchronization between the DQ1 and the DQ2 output from the serialize 154 may be misaligned somewhat. In this case, an output buffer (not illustrated) for synchronization between the DQ1 and the DQ2 may be further provided. For clarity of illustration, the DQ1 and the DQ2 are illustrated as being synchronized with each other.

Serialization of the serialize 154 is described in the above embodiment, and thus, a description thereof will not be repeated here. With the above-described method, serialization may be performed even before data is read from all memory cells. Accordingly, a read speed of the memory device 200 may be improved. For example, the serialization may be started before data is read from the all of the memory cells.

Figure 11:
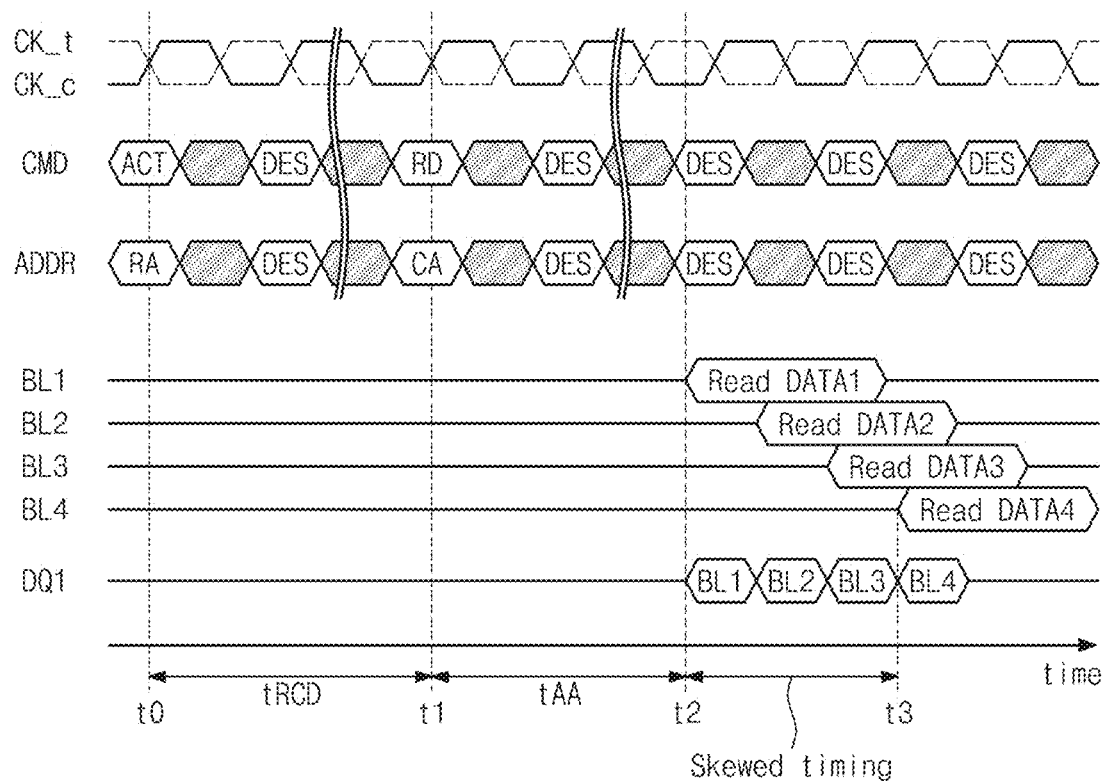
FIG. 11 is a timing diagram for describing a read operation of the memory device of FIG. 9.

FIG. 11 is a timing diagram for describing a read operation of the memory device 200 of FIG. 9. Unlike the read operation of FIG. 10, a read operation of FIG. 11 will be described under assumption that a burst length is "4". To help understanding, a description will be given with reference to FIGS. 1, 2, 9, and 10.

In the embodiment of FIG. 11, a time point when the column address CA and the read command RD are provided to the column decoder 240 is determined not based on a time point when the memory cell MC4 farthest from the column decoder 240 is activated but based on a time point when any other memory cell is activated. For example, a time point when the column address CA and the read command RD are provided to the column decoder 240 may be determined based on a time point when the memory cell MC1 closest to the column decoder 240 is activated. Accordingly, it may be possible to make a timing (i.e., t1), at which the read command RD and the column address CA are input to the column decoder 240, earlier.

After a reference time tRCD elapses from a time point (i.e., t0) when the first memory cell MC1 is activated, at time t1, the column address CA and the read command RD are provided to the column decoder 240. Unlike the embodiment of FIG. 10, in the embodiment of FIG. 11, since pieces of data read from memory cells connected to the first word line WL1 constitute one DQ, pieces of read data Read DATA1 to Read DATA4 are sequentially read from the first to fourth memory cells MC1 to MC4. That is, a time period from a time point when the first read data Read DATA1 is read to a time point when the fourth read data Read DATA4 is read, that is, the skewed timing is (t3–t2).

The serialize 154 (refer to FIG. 2) of the peripheral circuit 250 may generate serialized DQ1 by sequentially latching pieces of deserialized read data Read DATA1 to Read DATA4. Serialization of the serialize 154 is described in the above embodiment, and thus, a description thereof will not be repeated here.

Since the embodiment described with reference to FIG. 10 and the embodiment described with reference to FIG. 11 are based on the memory device 200 of FIG. 9, the memory device 200 according to an embodiment of the inventive concept may operate in various read modes by changing a burst length. The memory device 200 according to an embodiment of the inventive concept may operate in various read modes in consideration of various factors such as the size of a memory bank, whether a bad block is present, and system resources, and thus, the performance of the memory device 200 may be further improved.

The read operation of the memory device 200 is described with reference to FIGS. 10 and 11. The above-described operating method of the memory device 200 may be similarly applied to the write operation. For example, in the case where a write request is received from a host, the command decoder 153 (refer to FIG. 2) of the peripheral circuit 250 may generate the row address RA and the activation signal ACT by using a command CMD and an address ADDR from the host and may provide the row address RA and the activation signal ACT to the row decoder 220. After a memory cell MC1 closest to the row decoder 220 is activated and "tRCD" elapses, the command decoder 159 provides the column address CA and the write command WR to the column decoder 250. That is, a write speed of the memory device 200 may be improved by advancing a time point when the column address CA and the write command WR are provided. In addition, since the deserializer 155 (refer to FIG. 2) performs deserialization as soon as the write data is received, the decrease in write speed due to an increase in the skewed timing may be prevented.

Figure 12:
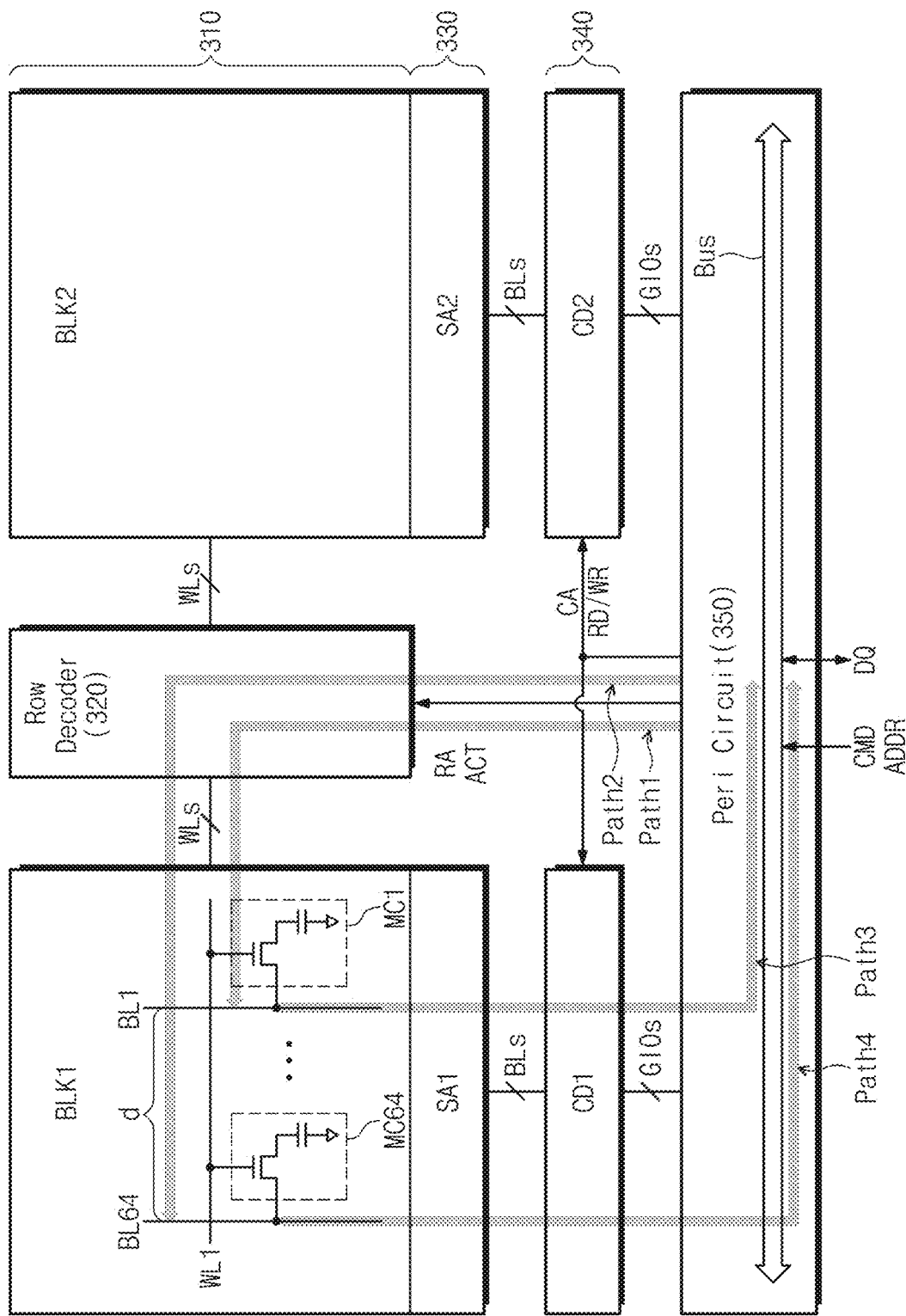
FIG. 12 is a block diagram illustrating an example of a memory device according to an exemplary embodiment of the inventive concept.

FIG. 12 is a block diagram illustrating a memory device according to an exemplary embodiment of the inventive concept. Referring to FIG. 12, a memory device 300 includes a memory bank 310, a row decoder 320, a sense amplifier circuit 330, a column decoder circuit 340, and a peripheral circuit 350.

The memory bank 310 includes a first memory block BLK1 and a second memory block BLK2. An embodiment is exemplified in FIG. 12 where the first memory block BLK1 includes memory cells connected to "64" bit lines. A memory cell, which is closest to the row decoder 320, from among memory cells connected to a first word line WL1 is a first memory cell MC1, and a memory cell farthest from the row decoder 320 is a 64th memory cell MC64. The second memory block BLK2 has a structure similar to that of the first memory block BLK1, and memory cells are thus omitted for ease of illustration.

The sense amplifier circuit 330 includes a first sense amplifier SA1 and a second sense amplifier SA2. The first sense amplifier SA1 may be provided for a read or write operation of the first memory block BLK1, and the second sense amplifier SA2 may be provided for a read or write operation of the second memory block BLK2.

The column decoder circuit 340 includes a first column decoder CD1 and a second column decoder CD2. The first column decoder CD1 is provided for selecting bit lines BLs connected to the first memory block BLK1, and the second column decoder CD2 is provided for selecting bit lines BLs connected to the second memory block BLK2.

A configuration of the memory device 300 is similar to a configuration of the memory device 100 of FIG. 1 except for the above description, and thus, a description thereof will not be repeated here.

As illustrated in FIG. 12, in the case where the memory blocks BLK1 and BLK2 are respectively arranged on opposite sides of the row decoder 320 and constitute one memory bank 310, pads (not illustrated) for a command CMD and an address ADDR and pads (not illustrated) for data DQ may be arranged in the vicinity of the center of the peripheral circuit 350. In this case, paths (e.g., path1 and path2) through which the activation signal ACT is provided to memory cells are different from each other, and paths (e.g., path3 and path4) through which data is output from the memory cells are different from each other. This operation may be also applied to the write operation. The peripheral circuit 350 may include a data bus, where the command CMD, address ADDR, and data DQ may be communicated across the data bus.

Figure 13:
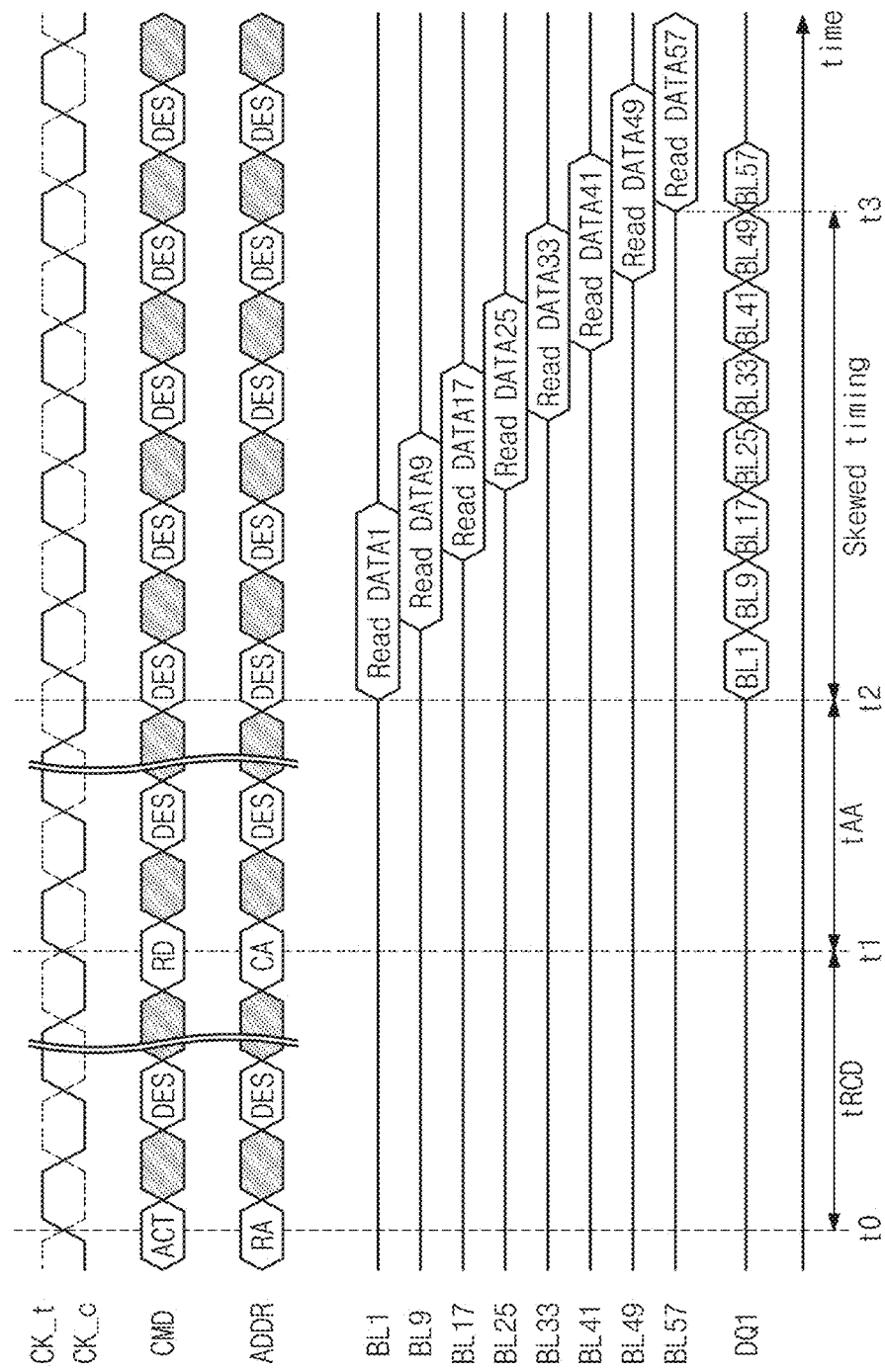
FIG. 13 is a timing diagram for describing a read operation of the memory device of FIG. 12.

FIG. 13 is a timing diagram for describing a read operation of the memory device 300 of FIG. 12. A read operation of FIG. 13 will be described under the assumption that a burst length is "8". An example in which DQ1 is generated by using data read from memory cells connected to bit lines BL1, BL9, BL17, BL25, BL33, BL41, BL49, and BL57 will be described. To help understanding, a description will be given with reference to FIGS. 2, 12, and 13.

When a read request is received from a host, at time t0, the row address RA and the activation signal ACT are input to the first memory block BLK1. A first word line WL1 is selected by the row address RA, and the activation signal ACT is provided to the first word line WL1. For example, the address buffer 151 (refer to FIG. 2) of the peripheral circuit 350 may generate the row address RA in response to the read request from the host. For example, the active controller 152 (refer to FIG. 2) of the peripheral circuit 350 may generate the activation signal ACT in response to the read request from the host, or the activation signal ACT may be directly received from the host as described with reference to FIG. 3.

After a reference time (i.e., tRCD) elapses from a time point (i.e., t0) when the first memory cell MC1 is activated by the activation signal ACT, the column address CA generated by the address buffer 151 and the read command RD are provided to the first column decoder CD1. The read command RD is provided to the first column decoder CD1 not based on a time point when a 64th memory cell MC64 farthest from the row decoder 320 is activated but based on a time point when a first memory cell MC1 is activated, and thus, it is possible to advance a timing when the read command RD is provided. That is, a read speed of the memory device 300 may be improved.

At time t2, data is read from each memory cell. Since the first memory cell MC1 is closest to a DQ pad (not illustrated), first read data Read DATA1 is first output from the first memory cell MC1 connected to a first bit line BL1. In contrast, 57th read data Read DATA57 is finally output from a 57th memory cell MC57 connected to a 57th bit line BL57.

The serialize 154 may generate DQ1 even before all data is read. For example, a serialization process performed by the serialize 154 may be started before all of the data has been read. In a normal read operation, serialization is performed after data is read from all memory cells. That is, a read operation may be delayed by the skewed timing. However, the serialize 154 performs serialization as soon as the first read data Read DATA1 is output from a memory cell. Serialization of read data is described in the above embodiments, and thus, a description thereof will not be repeated here. Accordingly, since a read time is shortened by the skewed timing, the read speed of the memory device 300 may be improved.

A read operation associated with DQ1 is illustrated in FIG. 13, but the above-described operation may be similarly applied to data read from the remaining memory cells. For example, DQ2 may be generated by using data read from memory cells connected to bit lines BL2, BL10, BL18, BL26, BL34, BL42, BL50, and BL58. As in the above description, DQ8 may be generated by using data read from memory cells connected to bit lines BL8, BL16, BL24, BL32, BL40, BL48, BL56, and BL64.

A read operation of the memory device 300 is described with reference to FIG. 13, but the above-described scheme may be similarly applied to a write operation. This is similar to the description given through embodiments associated with the above-described write operation, and thus, a description thereof will not be repeated here.

Figure 14:
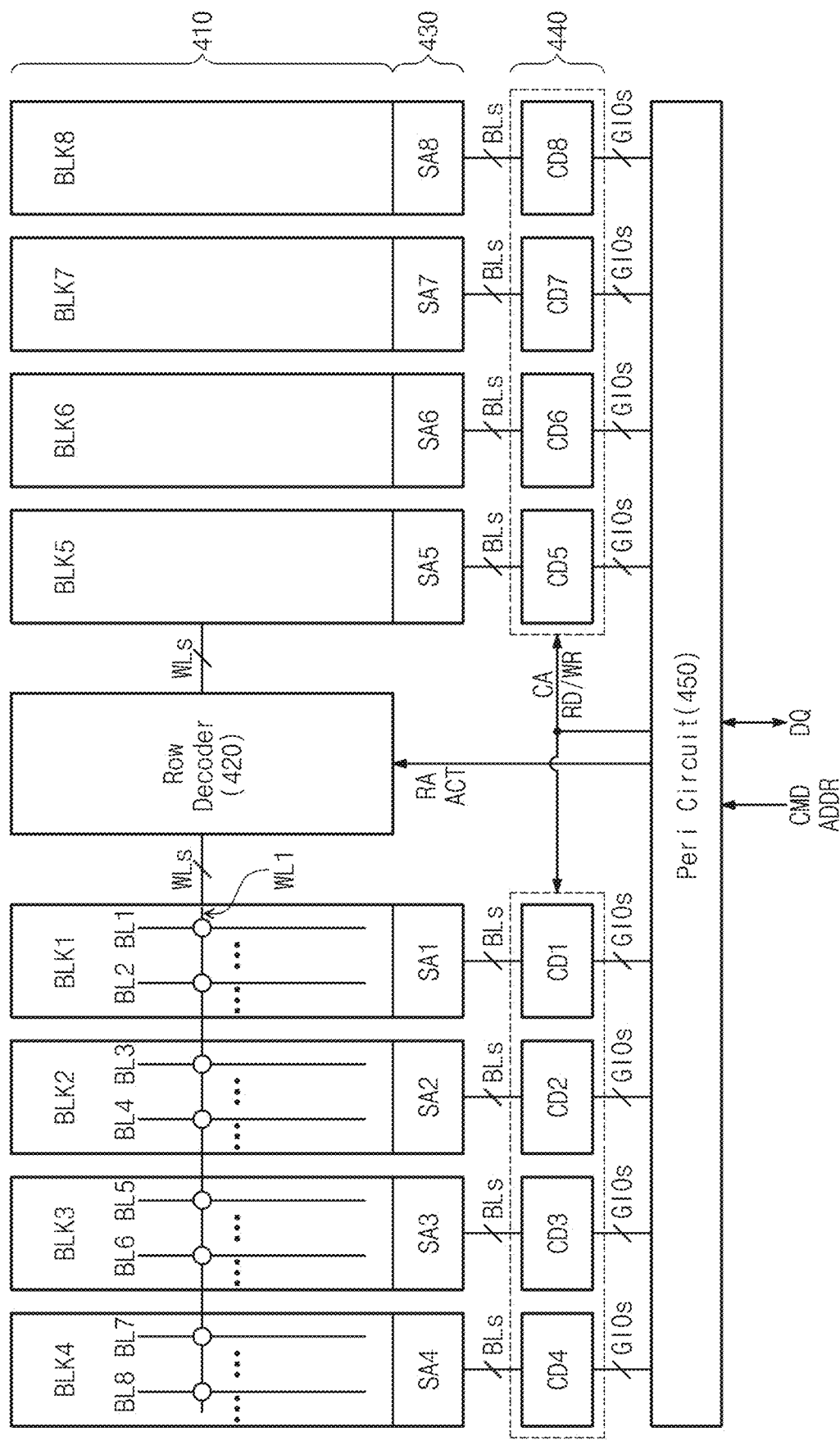
FIG. 14 is a block diagram illustrating an example of a memory device according to an exemplary embodiment of the inventive concept.

FIG. 14 is a block diagram illustrating a memory device according to an exemplary embodiment of the inventive concept. A memory device 400 includes a memory bank 410, a row decoder 420, a sense amplifier circuit 430, a column decoder circuit 440, and a peripheral circuit 450.

The memory bank 410 includes a first memory block BLK1 to an eighth memory block BLK8. The first to fourth memory blocks BLK1 to BLK4 are arranged on one side of the row decoder 420, and the fifth to eighth memory blocks BLK5 to BLK8 are arranged on an opposite side of the row decoder 420. Capacities of the first to eighth memory blocks BLK1 to BLK8 may be the same each other. For example, each memory block may include the same number of bit lines. A first word line WL1 is connected to memory cells of the first to fourth memory blocks BLK1 to BLK4. In FIG. 14, two bit lines are illustrated in one memory block. However, a plurality of bit lines may be further arranged between two bit lines adjacent to each other. For convenience of description, a first bit line BL1 to an eighth bit line BL8 are illustrated in FIG. 14.

The row decoder 420 is connected to the first to eighth memory blocks BLK1 to BLK8 through a plurality of word lines WLs. As illustrated in FIG. 14, the row decoder 420 is arranged at the center of the memory blocks. The sense amplifier circuit 430 includes a first sense amplifier SA1 to an eighth sense amplifier SA8. The column decoder circuit 440 includes a first column decoder CD1 to an eighth column decoder CD8. Operations and configurations of the row decoder 420 and the peripheral circuit 450 are similar to those of the above-described embodiments, and thus, a description thereof will not be repeated here.

The embodiments of the inventive concept may be applicable to a case where a capacity of the memory bank 410 is relatively large as illustrated in FIG. 14. For example, a plurality of DQs may be generated from data read from the first to fourth memory blocks BLK1 to BLK4. For example, DQ1 of the plurality of DQs may be composed of data read from memory cells connected to the bit lines BL1 to BL8. A distance between adjacent bit lines of bit lines through which data is read may be generally alike such that data read from memory cells connected to the bit lines BL1 to BL8 is sequentially delayed by a constant period. For example, a distance between BL1 and BL2 may be similar to a distance between BL4 and BL5.

Figure 15:
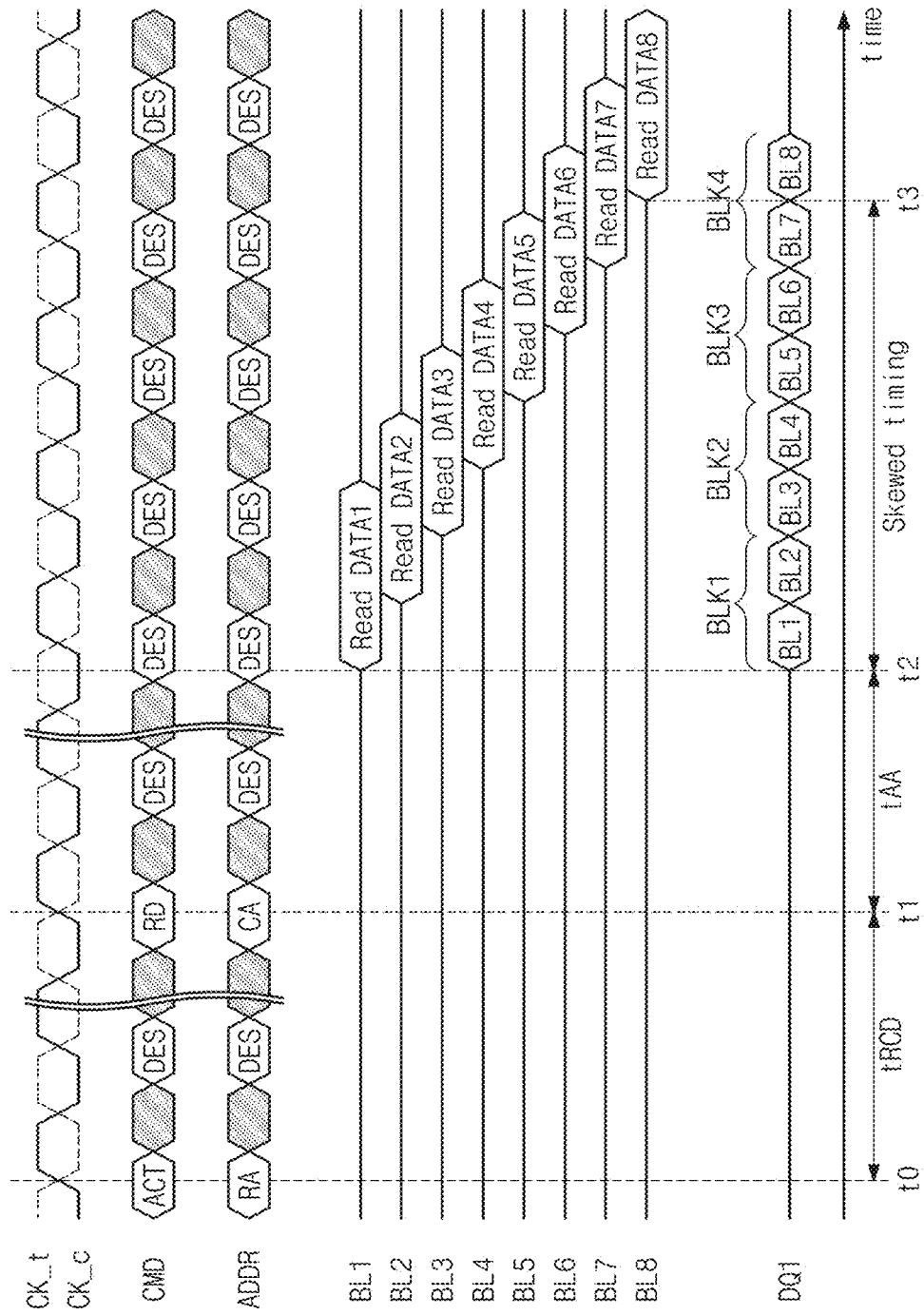
FIG. 15 is a timing diagram for describing a read operation of the memory device of FIG. 14.

FIG. 15 is a timing diagram for describing a read operation of the memory device 400 of FIG. 14. A read operation of FIG. 15 will be described under assumption that a burst length is "8". An example in which DQ1 is generated by using data read from memory cells connected to bit lines BL1 to BL8 will be described. To help understanding, a description will be given with reference to FIGS. 14 and 15.

At time t0, memory cells connected to a first word line WL1 are activated by the activation signal ACT. According to an exemplary embodiment, "tRCD" is calculated from a time point when memory cells connected to a first bit line are activated. Accordingly, a time point t1 when the column address CA and the read command RD are provided to the column decoder 440 may become faster.

At time t2, data Read DATA1 to Read DATA8 are read from memory cells. Serialization may be made as soon as the read data Read DATA1 is read from a memory cell closest to the row decoder 420. As illustrated in FIG. 15, serialized data DQ1 may be composed of data read from the memory blocks BLK1 to BLK4. Without embodiments of the inventive concept, the skewed timing may become greater as the capacity of the memory bank 410 increases, thereby causing a decrease in read speed of the memory device 400. However, according to the operating method of the inventive concept, the read speed of the memory device 400 may be uniformly maintained regardless of the capacity of the memory bank 410. The read operation is described with reference to FIG. 15. The embodiment of FIG. 15 may be also applicable to a write operation, and thus, a description thereof will not be repeated here.

Figure 16:
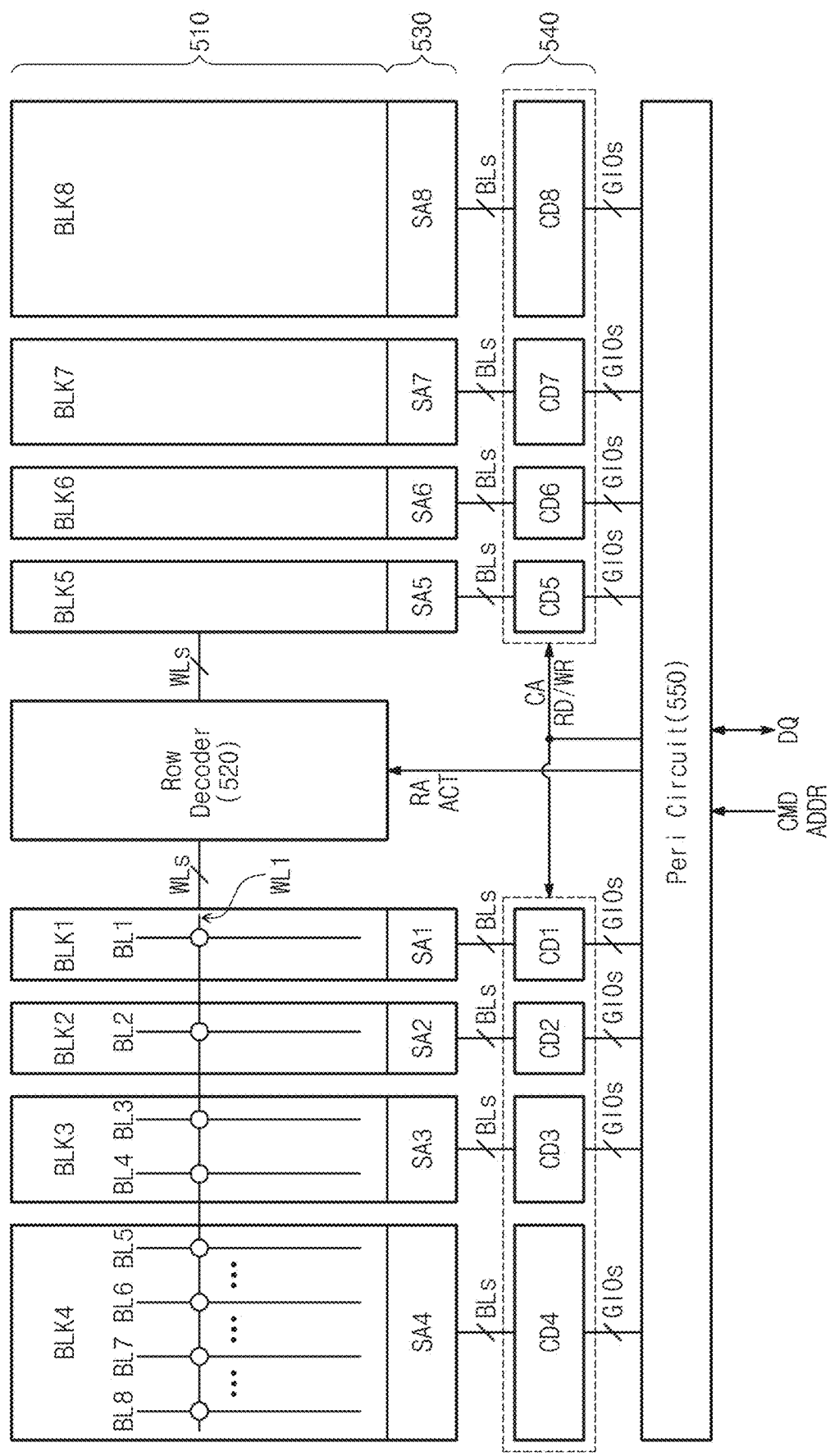
FIG. 16 is a block diagram illustrating an example of a memory device according to an exemplary embodiment of the inventive concept.

FIG. 16 is a block diagram illustrating a memory device according to an exemplary embodiment of the inventive concept. A memory device 500 includes a memory bank 510, a row decoder 520, a sense amplifier circuit 530, a column decoder circuit 540, and a peripheral circuit 550.

In an embodiment, capacities of first and second memory blocks BLK1 and BLK2 are the same as each other. In this embodiment, the number of bit lines connected to the first memory block BLK1 is the same as the number of bit lines connected to the second memory block BLK2. In an embodiment, a capacity of a third memory block BLK3 is twice the capacity of the first memory block BLK1. In this embodiment, the number of bit lines connected to the third memory block BLK3 is twice the number of bit lines connected to the first memory block BLK1. In an embodiment, a capacity of a fourth memory block BLK4 is four times the capacity of the first memory block BLK1. In this embodiment, the number of bit lines connected to the fourth memory block BLK4 is four times the number of bit lines connected to the first memory block BLK1. Elements of the memory device 500 are similar to elements of FIG. 14 except for capacities of memory blocks, and thus, a description thereof will not be repeated here.

Like the embodiment illustrated in FIG. 16, the embodiments of the inventive concept may be applicable to the case that a capacity of the memory bank 510 is relatively large and a capacity of a memory block increases twice whenever a distance from the row decoder 520 increases. For example, a plurality of DQs may be generated from data read from the first to fourth memory blocks BLK1 to BLK4. For example, DQ1 of the plurality of DQs may be composed of data read from memory cells connected to the bit lines BL1 to BL8. For example, a distance between adjacent bit lines of bit lines through which data is read may be generally alike such that data read from memory cells connected to the bit lines BL1 to BL8 is sequentially delayed by a constant period.

Figure 17:
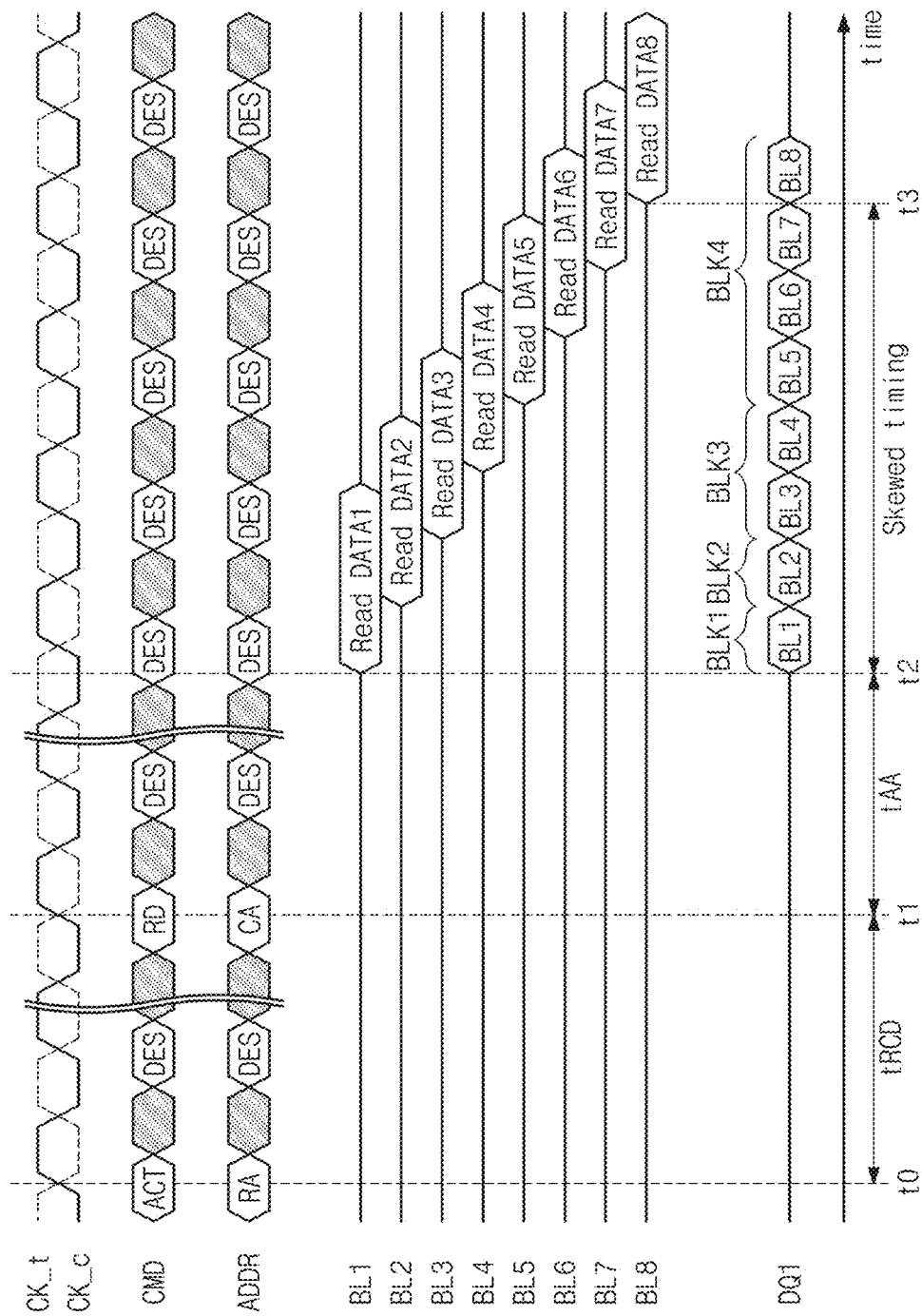
FIG. 17 is a timing diagram for describing a read operation of the memory device of FIG. 16.

FIG. 17 is a timing diagram for describing a read operation of the memory device 500 of FIG. 16. The timing diagram of FIG. 17 is similar to that of FIG. 15, and a duplicated description is thus omitted. However, the number of bits constituting serialized read data DQ1 is in proportion to the number of bit lines of each memory block. That is, data bits are read from the first to fourth memory blocks BLK1 to BLK4 in the ratios of 1:1:2:4. The read operation is described with reference to FIG. 17. The embodiment of FIG. 17 may be also applicable to a write operation, and thus, a description thereof will not be repeated here.

Figure 18:
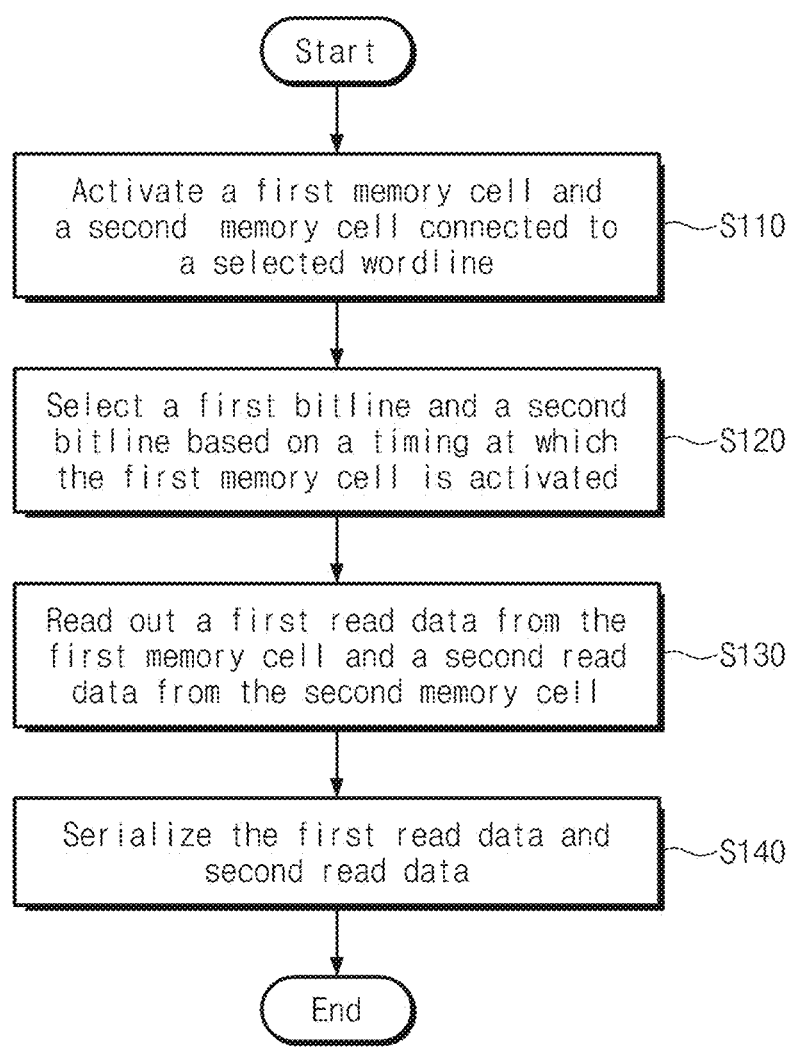
FIG. 18 is a flowchart illustrating an operating method of a memory device according to an exemplary embodiment of the inventive concept.

FIG. 18 is a flowchart illustrating an operating method of a memory device according to an exemplary embodiment of the inventive concept. For example, a read operation of the memory device will be described. To help understanding, a description will be given with reference to FIGS. 1, 2, 6, and 18.

In operation S110, a first memory cell and a second memory cell connected to a selected word line are activated. For example, a word line may be selected by a row decoder. For example, a first distance between the row decoder and the first memory cell is shorter than a second distance between the row decoder and the second memory cell.

In operation S120, a first bit line connected to the first memory cell and a second bit line connected to the second memory cell are selected based on a time point when the first memory cell is activated. For example, the first bit line and the second bit line may be selected by a column address input to a column decoder. According to an embodiment of the inventive concept, the first bit line and the second bit line are selected after the first memory cell is activated and a reference time (i.e., tRCD) elapses. That is, a read speed of the memory device may be improved by advancing a timing when the first bit line and the second bit line are selected.

In operation S130, first read data is read out from the first memory cell, and second read data is read out from the second memory cell. For example, selection transistors connected to the first and second bit lines may be turned on or off by a read command RD input to a column decoder.

In operation S140, the first read data and the second read data are serialized. In an embodiment, serialization may be made before the second read data has been completely provided to the serialize. Since the serialization is made before all read data has been completely provided to the serialize, the read speed may be improved. For example, the serialize may begin processing on a portion of the second read data already received prior to receiving the remainder of the second read data.

Figure 19:
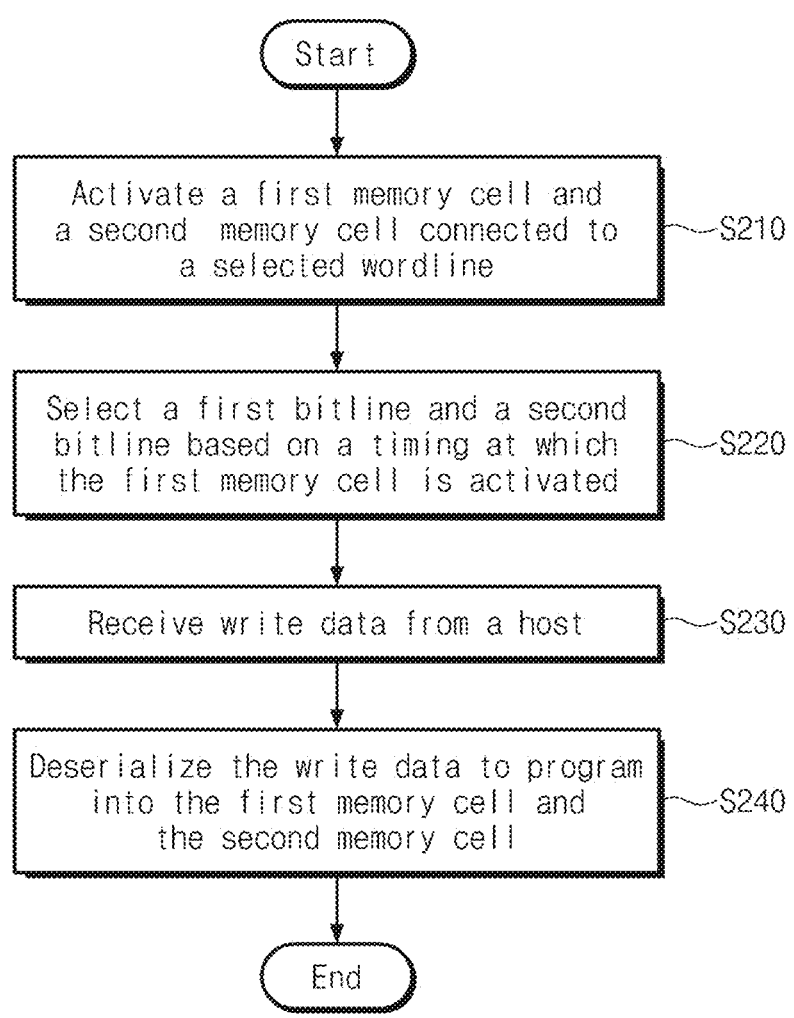
FIG. 19 is a flowchart illustrating an operating method of a memory device according to an exemplary embodiment of the inventive concept.

FIG. 19 is a flowchart illustrating a method of operating a memory device according to an exemplary embodiment of the inventive concept. For example, a write operation of the memory device will be described. To help understanding, a description will be given with reference to FIGS. 1, 2, 8, and 19.

To perform the read or write operation of the memory device, a word line is selected, and memory cells connected to the selected word line may be activated. That is, operation S210 and operation S220 of FIG. 19 are substantially the same as operation S110 and operation S120 of FIG. 18, and thus, a description thereof will not be repeated here.

In operation S230, write data is received from a host. For example, serialized write data DQ1 may be provided to a deserializer of a peripheral circuit.

In operation S240, the write data DQ1 is deserialized. In an embodiment, deserialization is performed before the write data has been completely received. For example, the deserialization may start to be performed on a portion of the write data already received before the remainder of the write data has been completely received. That is, first write data to be stored in the first memory cell is generated through a deserialization operation as soon as the write data DQ1 is received. Afterwards, second write data to be stored in the second memory cell may be generated. Since the deserialization is started before write data has been completely received, the write speed may be improved.

Figure 20:
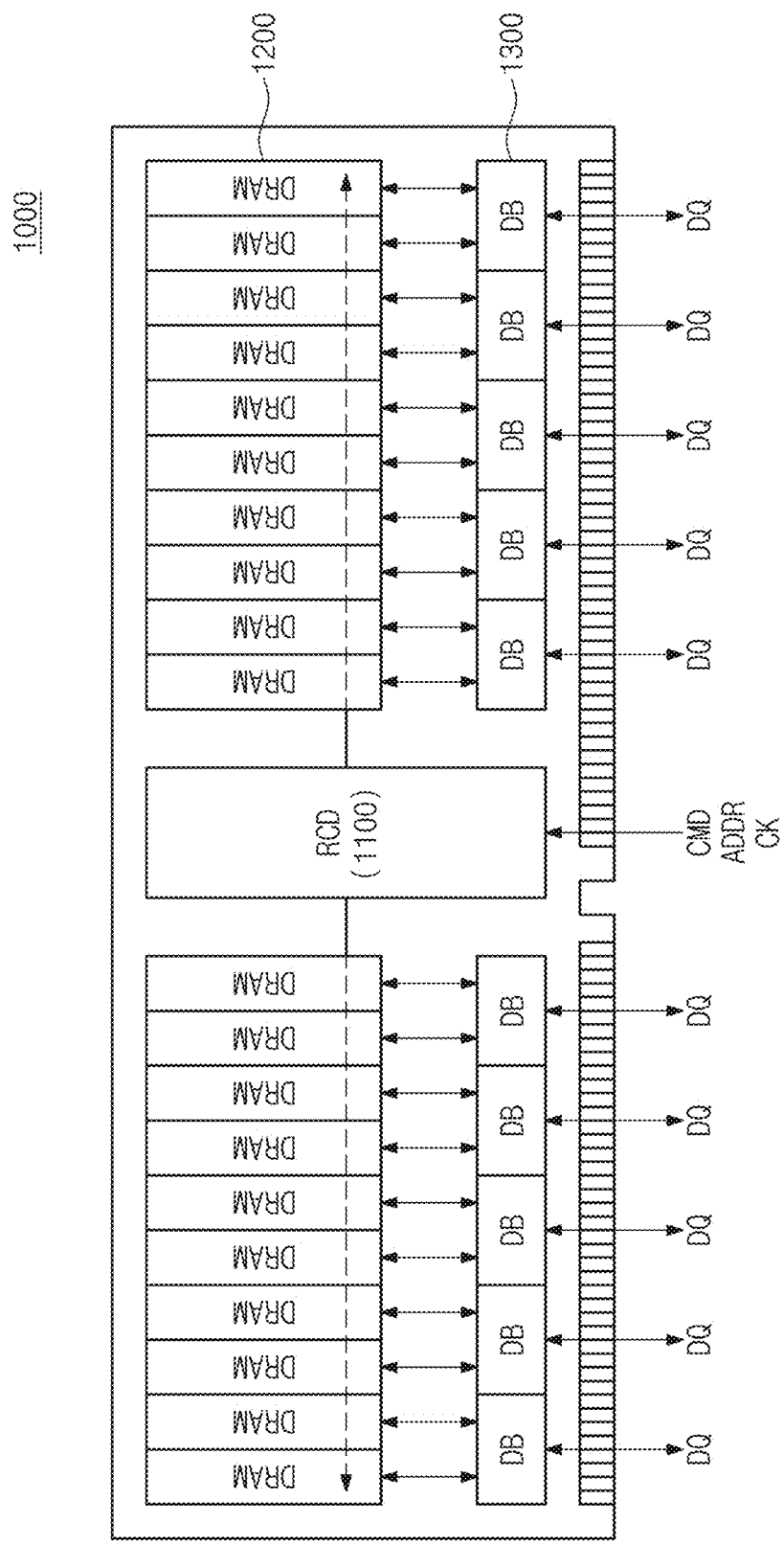
FIG. 20 is a view illustrating an example of a memory module to which a memory device according to an embodiment of the inventive concept is applied.

FIG. 20 is a view illustrating an example of a memory module (e.g., a memory card) to which a memory device according to an embodiment of the inventive concept may be applied. A memory module 1000 includes a register clock driver (RCD) 1100, a plurality of memory devices 1200, and a plurality of data buffers 1300. For example, each of the memory devices 1200 may be a DRAM.

Referring to FIG. 20, the register clock driver 1100 is arranged in the vicinity of the center of the memory module 1000. The memory devices 1200 are arranged on opposite sides of the register clock driver 1100. The data buffers 1300 are arranged on the opposite sides of the register clock driver 1100. However, the arrangement of elements of the memory module 1000 is not limited thereto.

The register clock driver 1100 may control overall operations of the memory module 1000. The register clock driver 1100 may receive a command CMD and an address ADDR from a host and may provide the command CMD and the address ADDR to each of the memory devices 1200.

Each of the memory devices 1200 may be implemented to operate according to an embodiment of the inventive concept. For example, "tRCD" of each memory device 1200 may be calculated from a time point when a memory cell closest to a row decoder is activated according to a read request or a write request from the host. Serialization may be started as soon as data is read from a memory cell closest to the row decoder during a read operation. As in the above description, deserialization may be started as soon as write data is received from the host. With the above-described methods, the read and write speeds may be improved.

The data buffers 1300 are connected to the memory devices 1200. The data buffers 1300 may temporarily store data DQ that the memory module 1000 exchanges with the outside. For example, the data buffers 1300 may receive data from the host and may provide the received data to the memory devices 1200. The data buffers 1300 may provide the host with data read from the memory devices 1200.

The data buffers 1300 may be implemented to be suitable for the double data rate (DDR) interface standard. For example, each of the data buffers 130 may be implemented to input and output eight data signals and two data strobe signals. For example, each of the data buffers 1300 may be implemented with a dual port SRAM.

While the inventive concept has been described with reference to exemplary embodiments thereof, it will be apparent to those skilled in the art that various changes and modifications may be made without departing from the spirit and scope of the inventive concept. Therefore, it should be understood that the above embodiments are not limiting, but illustrative.

What is claimed is:

1. A memory device comprising:
   a first memory cell connected to a word line and a first bit line;
   a second memory cell connected to the word line and a second bit line;
   a row decoder configured to:
     receive a first command and a row address,
     decode the row address,
     select the word line based on the decoded row address, and
     activate the selected word line based on the first command; and
   a column decoder configured to:
     receive a second command and a column address after a time point at which the first memory cell is activated and before a time point at which the second memory cell is activated,
     decode the column address, and
     select the first bit line based on the decoded column address,
   wherein a first distance between the row decoder and the first memory cell is shorter than a second distance between the row decoder and the second memory cell.

2. The memory device of claim 1, further comprising a peripheral circuit that comprises:
   an address buffer configured to generate the row address and the column address based on an address received from a source located outside the memory device;
   an active controller configured to generate an activation signal for activating the selected word line;
   a command decoder configured to generate a read command or a write command based on a command received from a source located outside the memory device.

3. The memory device of claim 1, further comprising:
   a serializer configured to serialize first read data read from the first memory cell and second read data read from the second memory cell to generate serialized read data,
   wherein the serializer outputs the first read data before the second read data is completely received.

4. The memory device of claim 3, wherein the serializer comprises:
   a latch configured to receive the first read data and the second read data; and
   a pulse generator configured to generate a plurality of pulses that are applied to the serialize to generate the serialized read data by using the first read data and the second read data.

5. The memory device of claim 1, further comprising:
   a deserializer configured to deserialize write data received from a source located outside the memory device,
   wherein the deserializer generates first write data to be stored in the first memory cell by deserializing the write data before second write data to be stored in the second memory cell is generated.

6. The memory device of claim 5, wherein the deserializer comprises:
   a pulse generator configured to generate a plurality of pulses that are applied to the deserializer to generate the first write data and the second write data by using the write data; and
   a data align circuit configured to align the first write data and the second write data.

7. The memory device of claim 1, wherein the first memory cell is a memory cell, which is closest to the row decoder, from among memory cells connected to the word line.

8. The memory device of claim 1, wherein each of the first and second memory cells is a dynamic random access memory (DRAM) cell.

9. The memory device of claim 1, wherein the first command is an activation command and the second command is a read command or a write command.

10. The memory device of claim 1, wherein a delay time is tRCD (ACT to internal read or write delay time).

11. A method of operating a memory device that comprises a first memory cell and a second memory cell connected to a row decoder through a word line and connected to a column decoder through a first bit line and a second bit line, the method comprising:
    receiving, by a row decoder of the memory device, a first command and a row address;
    decoding, by the row decoder, the row address;
    selecting, by the row decoder, the word line based on the row address;
    activating, by the row decoder, the first memory cell connected to the selected word line;
    receiving, by a column decoder of the memory device, a second command and a column address after a time point at which the first memory cell is activated and before a time point at which the second memory cell is activated;
    decoding, by the column decoder, the column address; and
    selecting, by the column decoder, the first bit line based on the decoded column address,
    wherein a first distance between the row decoder and the first memory cell is shorter than a second distance between the row decoder and the second memory cell.

12. The method of claim 11, further comprising:
reading first read data and second read data from the first memory cell and the second memory cell respectively based on a read command input to the column decoder; and
serializing the first read data and the second read data by using a serializer,
wherein the first read data is output from the serializer before the second read data is completely received.

13. The method of claim 11, further comprising:
receiving write data from a source located outside the memory device based on a write command input to the column decoder; and
deserializing the write data by using a deserializer,
wherein first write data to be stored in the first memory cell is output from the deserializer before second write data to be stored in the second memory cell is generated.

14. The method of claim 11, wherein the first memory cell is a memory cell, which is closest to the row decoder, from among memory cells connected to the word line.

15. The method of claim 11, wherein each of the first and second memory cells is a dynamic random access memory (DRAM) cell.

16. A memory device comprising:
a first memory cell connected to a word line and a first bit line;
a second memory cell connected to the word line and a second bit line;
a row decoder configured to select the word line; and
a serializer configured to serialize first read data read from the first memory cell and second read data read from the second memory cell to generate serialized read data,
wherein a first distance between the row decoder and the first memory cell is shorter than a second distance between the row decoder and the second memory cell,
wherein the first bit line is selected based on a time point when the first memory cell is activated, and
wherein the serializer outputs the first read data before the second read data is completely received.

17. The memory device of claim 16, wherein the serializer comprises:
a latch configured to receive the first read data and the second read data; and
a pulse generator configured to generate a plurality of pulses that are applied to the serializer to generate the serialized read data by using the first read data and the second read data.

18. The memory device of claim 16, further comprising:
a deserializer configured to deserialize write data received from a source located outside the memory device,
wherein the deserializer generates first write data to be stored in the first memory cell by deserializing the write data before second write data to be stored in the second memory cell is generated.

19. The memory device of claim 18, wherein the deserializer comprises:
a pulse generator configured to generate a plurality of pulses that are applied to the deserializer to generate the first write data and the second write data by using the write data; and
a data align circuit configured to align the first write data and the second write data.

* * * * *